United States Patent
Onishi et al.

[11] Patent Number: 5,920,142
[45] Date of Patent: Jul. 6, 1999

[54] ELECTRONIC PART AND A METHOD OF PRODUCTION THEREOF

[75] Inventors: Keiji Onishi, Settsu; Hideki Iwaki, Neyagawa; Shun-ichi Seki, Amagasaki; Yutaka Taguchi; Tsukasa Shiraishi, both of Takatsuki; Yoshihiro Bessho, Higashiosaka; Osamu Kawasaki, Kyoto; Kazuo Eda, Nara, all of Japan

[73] Assignee: Matsushita Electric Industrial Co., Ltd., Osaka-fu, Japan

[21] Appl. No.: 08/813,279

[22] Filed: Mar. 10, 1997

[30] Foreign Application Priority Data

| Mar. 8, 1996 | [JP] | Japan | 8-051248 |
| Dec. 17, 1996 | [JP] | Japan | 8-336775 |
| Jan. 24, 1997 | [JP] | Japan | 9-011407 |

[51] Int. Cl.⁶ .................................................. H01L 41/08
[52] U.S. Cl. ...................... 310/313 R; 310/344; 310/348
[58] Field of Search .............................. 310/313 R, 340, 310/344, 348

[56] References Cited

U.S. PATENT DOCUMENTS

| 4,047,129 | 9/1977 | Ishiyama | 310/313 R X |
| 4,734,608 | 3/1988 | Takoshima | 310/344 X |
| 5,623,236 | 4/1997 | Yoshinaga et al. | 310/344 X |

FOREIGN PATENT DOCUMENTS

| 0 367 181 | 5/1990 | European Pat. Off. |
| 0 495 316 | 7/1992 | European Pat. Off. |
| 0 637 871 | 2/1995 | European Pat. Off. |
| 0 742 643 | 11/1996 | European Pat. Off. |
| 0091707 | 5/1985 | Japan | 310/344 |
| 0226208 | 9/1989 | Japan | 310/313 R |
| 0305013 | 12/1990 | Japan | 310/313 R |
| 4042603 | 2/1992 | Japan | 310/313 R |
| 04056510 | 2/1992 | Japan . | |
| 5251980 | 9/1993 | Japan | 310/313 R |
| 5335878 | 12/1993 | Japan | 310/313 R |
| 6140870 | 5/1994 | Japan | 310/313 R |
| 8-307197 | 11/1996 | Japan . | |

OTHER PUBLICATIONS

K. Onishi et al., "A 1.5 GHz–Band SAW Filter Using Flip–Chip–Bonding Technique", IEEE, 1993 Japan Int'l Manufacturing Technology Symposium, pp. 109–112.

European Search Report for Int'l Appln No. EP 97 10 3617 dated Apr. 16, 1998.

*Primary Examiner*—Mark O. Budd
*Attorney, Agent, or Firm*—Ratner & Prestia

[57] ABSTRACT

The present invention relates to an electronic part used for mobile communications apparatuses and the like, and more particularly to an electronic part, such as an acoustic surface-wave device, a piezoelectric ceramic device or the like, which requires an oscillation space near the surface of the functional device chip thereof, and a method of production thereof. With this method, a space retainer for forming a sealed space at the functional portion of the chip can be hermetically sealed and have high moisture resistance, and the process of forming the space retainer can be carried out easily.

The electronic part of the present invention comprises a functional device chip, a space retainer for forming a sealed space at the functional portion of the chip, a circuit substrate to which the chip is secured, electrode interconnection portions for establishing electric connection between the chip and the circuit substrate, and a sealing resin for covering and sealing at least the space retainer, wherein the space retainer comprises a support layer made of a synthetic resin film, provided with an opening enclosing the functional portion and joined onto the main surface, and a cover formed and joined onto the support layer so as to cover the functional portion and form a sealed space between the cover and the functional portion.

48 Claims, 15 Drawing Sheets

Fig.14A
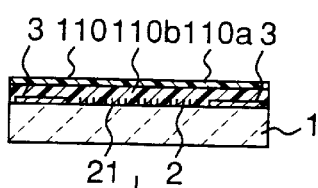
Fig.14D
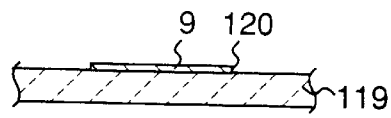
Fig.14B
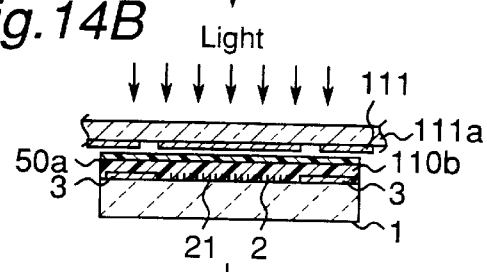
Fig.14E
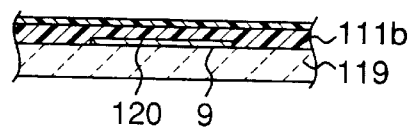
Fig.14C
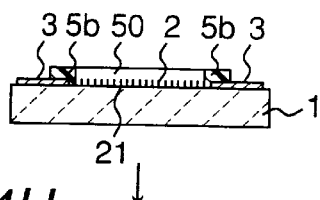
Fig.14F
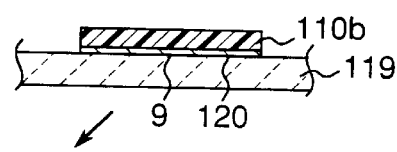
Fig.14H
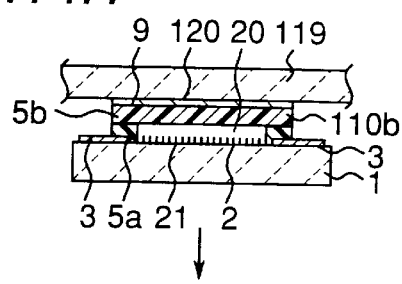
Fig.14G
Fig.14I
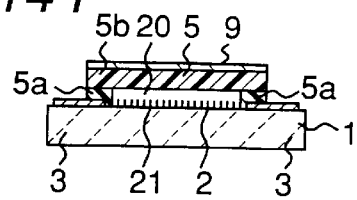

ELECTRONIC PART AND A METHOD OF PRODUCTION THEREOF

BACKGROUND OF THE INVENTION

1. Field of the Invention

The present invention relates to an electronic part used for mobile communications apparatuses and the like, and a method of production thereof, and more particularly to an electronic part, such as an acoustic surface-wave device, a crystal device or a piezoelectric ceramic device, which requires an oscillation space near the surface of the functional device chip thereof, and a method of production thereof.

2. Prior Art

As the progress of mobile communications, electronic parts, a kind of key devices constituting apparatuses, are requested to be made more compact, lower in profile and higher in performance.

FIG. 20 shows the structure of a conventional electronic part having a functional portion 2 as an oscillation surface on the main surface 21 of a piezoelectric oscillation device. A functional device chip 1 is secured to a package 206 via an adhesive 205. Electric conduction between the chip 1 and the package 206 is established by electrode interconnection portions 6 comprising thin metallic wires made of gold, aluminum or the like. Furthermore, a metallic protection cap 207 is joined to the package 206 by seam welding or the like so as to ensure hermetic sealing.

However, in the case of an electronic part with such conventional thin metallic wires, the package is required to have lands for connecting the thin metallic wires to the package and is also required to have a joint portion for joining a cover, thereby causing limitations when making the electronic part more compact. In addition, as the operation frequency of an electronic part, in particular, such an electronic part as an RF acoustic surface-wave device operating at radio frequencies, is higher, the inductance of the thin metallic wires becomes nonnegligible.

As an approach to cope with the trend of making electronic parts more compact and operable at radio frequencies, instead of the conventional wire bonding mounting method, face-down mounting of acoustic surface-wave devices has been attempted by Onishi, et al as described in "A 1.5 GHz-Band SAW Filter Using Flip-Chip-Bonding Technique", Proceedings on 1993 Japan IEMT Symposium, pp109–112).

A conventional electronic part produced by a face-down mounting method and a method of production thereof are described below. FIG. 21 is a schematic sectional view showing the structure of a conventional electronic part wherein a surface oscillation portion, a functional portion 2, is disposed as the above-mentioned functional device on one main surface of an acoustic surface-wave device. The electronic part is provided with conductive projection portions on electrode pads 3 formed on the functional device chip 1. Furthermore, face-down mounting is carried out as follows: an electrode connection member 6 obtained by transferring and applying a conductive adhesive 6b onto the conductive projection portion 6a is made contact with electrode pads 83 on a package or a circuit substrate made of alumina, glass-ceramics or the like, and face-down mounting was carried out so as to establish external conduction. Moreover, a sealing resin 7 was used to reinforce the adhesion, because the adhesion strength between the chip 1 and the circuit substrate 8 is weak. Besides, a highly viscous insulating resin is used for the sealing resin 7 so as to obtain an oscillation space 20 around the functional portion 2. Additionally, a metallic protection cap 207 is connected to the circuit substrate 8 so as to obtain hermetic sealing at the space of the functional portion.

However, the conventional electronic part has the problem of requiring strict control of the viscosity and charge amount of the sealing resin in order to maintain the space near the functional portion of the functional device chip. To solve this problem, as disclosed in Japanese Laid-open Patent Application No. 8-307197, a method is proposed wherein the sealing resin can be charged easily by providing a protection circuit substrate, that is, a space retainer having a dent or cavity on the inner surface corresponding to the vicinity of the functional portion of the chip.

As shown in FIG. 22, in a conventional electronic part, a hermetically sealed space 20 is maintained in the functional portion 2 by directly bonding the space retainer 5 having a cavity portion onto the main surface 21 around the functional portion 2 of the functional device chip 1. The cavity portion inside the space retainer is formed by the corrosion method in a surface region facing the functional portion at a ceramic piece made of such crystal, other piezoelectric crystal or glass as the chip material of the acoustic surface-wave device so as to obtain the space retainer 5, and direct joint by chemical covalent bond between the space retainer and the main surface around the functional portion is used. Since the functional portion of the chip 1 is protected by the space retainer 5, the sealing resin 7 can be fully charged, thereby making the control of the sealing resin easier.

The sealing resin can be controlled easily by providing the space retainer to form the sealing space. However, alkaline washing is necessary in the process of direct joint between the functional device chip and the space retainer. Therefore, an aluminum electrode cannot be applied to the functional portion of the chip, and the process of forming the space retainer and directly joining the space retainer becomes complicated, resulting in higher cost. In addition, on the main surface of the chip, electrode wires are formed between the functional portion and the electrode pads, generating stepped portions. The fringe portion of the hard and rigid space retainer is directly joined onto the main surface of the chip, while crossing the stepped portions of the electrodes. Therefore, it is difficult to fully obtain hermetic sealing in the space of the functional portion between the main surface and the fringe portion of the space retainer. In this respect of obtaining hermetic sealing, the protection cap was necessary just as in the case of the conventional device.

Accordingly, an object of the present invention is to form a space forming structure having sufficient hermetic sealing at low cost. Another object of the present invention is to provide a reliable electronic part produced by face-down mounting at low cost in the protection structure of the functional portion, and allowing easy control of the sealing resin, and a method of production thereof.

SUMMARY OF THE INVENTION

In the electronic part of the present invention, the above-mentioned space retainer is formed from a relatively softer synthetic resin to obtain hermetic sealing at the joint portion between the main surface of the functional device chip and the fringe portion of the space retainer. For this purpose, the space retainer comprises two layers: a support layer made of a synthetic resin film having an opening around the functional portion and joined onto the main surface, and a cover covering the functional portion and jointly formed on the support layer while forming a hermetic space between the support layer and the functional portion.

Furthermore, in the present invention, an isolation layer on the external surface of the cover is formed to cover the space retainer comprising the support layer and the cover. The isolation layer is used to isolate the sealing resin attached at the time of mounting from the cover resin so that they do not contact each other. Chemical reaction between the sealing resin and the cover resin is prevented in the process of the attaching and curing of the sealing resin. The isolation layer prevents the cover from making contact with the functional portion when the cover is deformed by swelling, thereby maintaining the oscillation surface in the functional portion.

In the production method of the electronic part of the present invention, to obtain the space retainer having the above-mentioned structure, the process of forming the space retainer comprises a step of forming the support layer by using a synthetic resin film so that the support layer has an opening enclosing the functional portion of the functional device chip on the main surface of the chip, and a step of forming the cover made of the synthetic resin film on the support layer and joining the cover.

In addition, in the production method of the electronic part, a step for forming the isolation layer for covering the external surface of the support layer is included after the formation of the space retainer. At the time of mounting, chemical reaction is prevented between the sealing resin and the cover resin in the sealing resin attaching and curing steps in the sealing resin charging process, thereby protecting the oscillation surface.

BRIEF DESCRIPTION OF THE DRAWINGS

FIGS. 14A–14I are views similar to that of FIGS. 13A–13I that show steps of forming the space retainer and the isolation layer at the chip functional portion of the functional device chip in accordance with another embodiment of the present invention;

EMBODIMENTS OF THE INVENTION

Figure 1A:
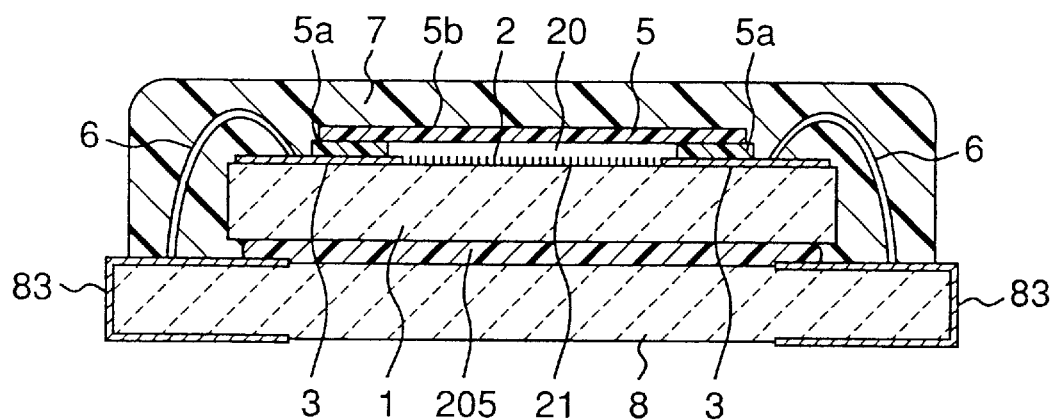
FIG. 1A is a sectional view of a face-up mounted electronic part provided with a space retainer at the functional portion of a functional device chip in accordance with the present invention.

Embodiments of the present invention will be described below referring to accompanying drawings.

A functional device chip 1 in accordance with the present invention is widely categorized as a device suited to have a space retainer 5 on at least one main surface 21. Such a functional device is a piezoelectric oscillation device having an oscillation surface at the functional portion on the surface of the chip. Such a device as having an oscillation surface at only one main surface 21 is an acoustic surface-wave oscillation device, for example. In the device, interdigital electrodes formed on the oscillation surface used as a functional portion 2 and electrode pads connected from the electrodes to leads are formed on the main surface.

A piezoelectric oscillation device having functional portions on two or more main surfaces is a bulk oscillation device, such as a crystal oscillator or a ceramic oscillator. Electrodes are formed on the oscillation surfaces used as two functional portions. Electrodes pads connected from the electrodes to the leads are formed on the main surface.

An electronic part in accordance with the present invention basically comprises a functional device chip 1 having a functional portion 2 on at least one main surface 21, a space retainer for forming a hermetically sealed space 20 at the functional portion of a chip, a circuit substrate 8 for securing the chip, an electrode connection portion 6 for making electric connection between the chip and the circuit substrate. and a sealing resin 7 for covering and sealing at least the space retainer 5.

In the case of face-up mounting, the production method of the electronic part of the present invention generally comprises a step of forming a space retainer for forming a hermetically sealed space at the functional portion of a functional device chip having the functional portion on at least one main surface: a step of attaching and securing the opposite surface of the main surface of the chip to the circuit substrate: a step of making electric connection between the chip and the circuit substrate via electrode interconnection portions, and a step of attaching a sealing resin so as to cover the space retainer.

Another production method of the electronic part, in the case of face-down mounting, generally comprises a step of forming a space retainer for forming a hermetically sealed space at the functional portion of a functional device chip which has the functional portion on at least one main surface (a step similar to that described above); a step of forming electrode interconnection portions on the chip or the circuit substrate; a step of connecting the electrode interconnection portions to the circuit substrate with the main surface disposed opposite to the circuit substrate; and a step of charging a sealing resin between the chip and the circuit substrate so as to hermetically seal the space retainer and the electrode interconnection portions.

In the present invention, the space retainer for forming the hermetically sealed space at the functional portion on the main surface of the functional device is basically provided on the main surface. The space retainer 5 comprises two layers: the support layer 5a made of a synthetic resin film, having an opening 50 surrounding the functional portion 2 and joined to the main surface 21, and the cover 5b jointly formed on the support layer 5a so as to cover the functional portion 2 by forming the hermetically sealed space 20 between the support layer 5a and the functional portion 2.

Furthermore, the process of forming the space retainer comprises two steps: a step of forming the support layer and a step of forming the cover.

First, the support layer of the space retainer is joined to the main surface so as to surround the functional portion in the opening, and has a predetermined thickness for determining a gap in the space so as to support the cover. The opening of the support layer is formed so as to evade one or two or more surface regions of the functional portion on the chip. The support layer is required to have a width enough to support the cover. FIG. 3 shows a support layer 5a having a simple shape. In FIG. 3, a rectangular frame-shaped support layer 5a is joined and secured around the functional portion 2 so that the functional portion 2 faces the opening 50.

Figure 3A:
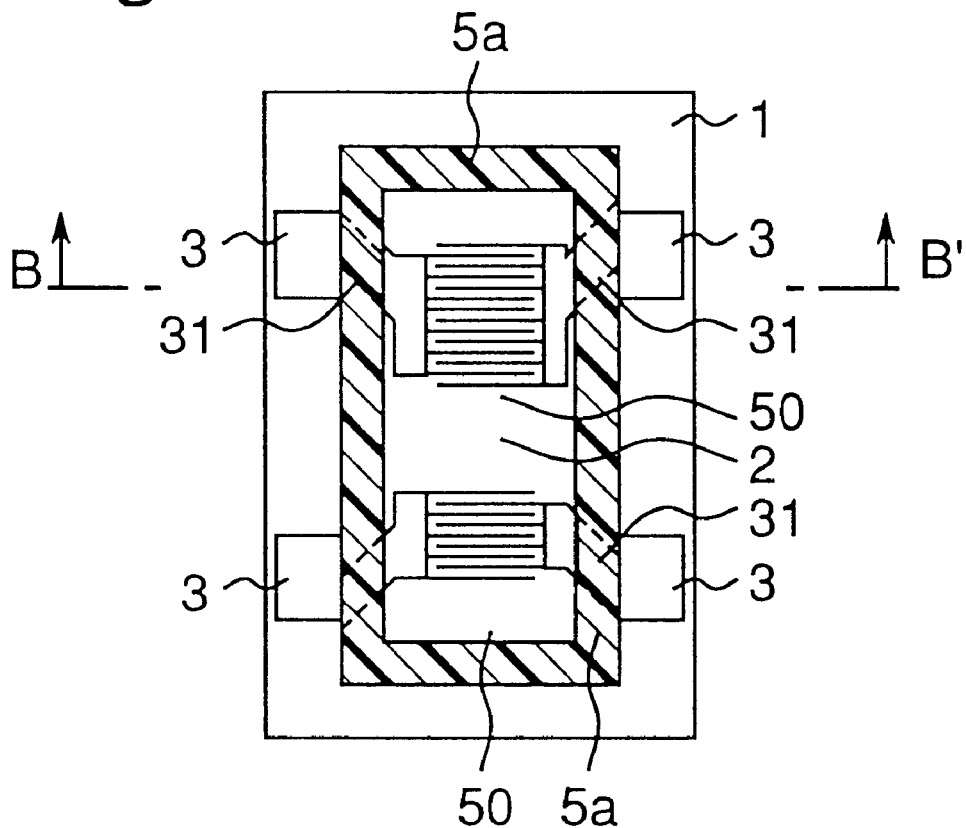
FIG. 3A is a side sectional view showing the functional device chip having the support layer structure of the space retainer in accordance with the present invention.
Figure 3B:
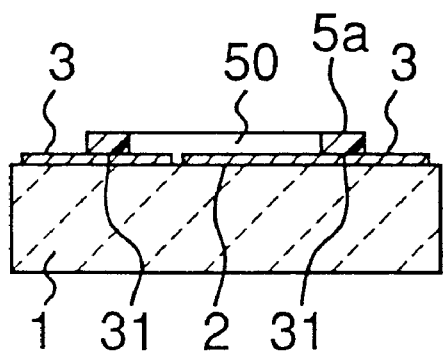
FIG. 3B is a vertical sectional view showing the functional device chip having the support layer structure of the space retainer in accordance with the present invention.

Since the support layer is made of a synthetic resin film and formed on the main surface, the support layer 5a can closely contact the main surface 21 while following the contour of the stepped portions 31 generated by the leads and electrodes as shown in FIG. 3A, thereby securing hermetic sealing between the support layer and the main surface. However, the shape of the support layer is not limited to a rectangle, and the shape of the opening of the support layer 111 is not limited specially.

A resin film pattern-formed on the main surface can be used for the support layer. A photosensitive resin film produced by the photoresist method is preferably used for the support layer. The photosensitive resin film is joined to the main surface and pattern-formed in a frame shape.

The step of forming the support layer includes pattern-forming of the photosensitive resin film on the main surface. For example, after a photo-curing organic film is placed over the functional portion and its periphery, the film is cured by light irradiation over a surface region corresponding to the shape of the support layer, uncured resin is removed, and the remaining synthetic resin film is used as it is. For this purpose, the use of a dry film resist is most desirable. A synthetic resin film made of polyimide or the like and pattern-formed by photo-curing in the same way as described above can also be used for another type of support layer.

In addition, a cured resin film placed over the main surface by printing can also be used for the support layer. In other words, a cured film of an insulation resin which is joined on the main surface, provided with an opening and attached in a frame shape for example can be used for the support layer. The step of forming the support layer includes screen printing of insulating resin liquid on the main surface.

For example, a film obtained by forming an insulating adhesive in a frame shape only around the functional portion by printing such as the screen printing method, and then by curing the adhesive by heating or light irradiation can be used for the support layer.

Furthermore, a cured member of a semi-solid resin sheet which is preformed, transferred and joined onto the main surface can be used for the support layer. The step of forming the support layer includes lamination of the resin sheet on the main surface of the functional device chip after an opening is formed at the resin sheet in its semi-cured condition. In other words, a film laminated on the chip and then thermoset can be used for the semi-cured resin sheet preformed to have an opening.

In the case of a chip having a plurality of functional portions, the support layer of the space retainer may be formed at each functional portion. Preferably, it is possible to form a wide support layer having openings provided corresponding to all functional portions.

The thickness of the support layer should be a value for maintaining a space required to keep transmission of acoustic surface waves good. In actual practice, however, since there are limitations in production processes and the cover has a warp, the thickness is required to be 3 $\mu$m or more. Preferably, the appropriate thickness of the support layer is 10 to 30 $\mu$m.

In case the support layer is made of an elastic material, the support layer can function as a sound absorption material, and can offer effects of preventing unwanted reflection of acoustic surface-waves and bulk waves, for example, on the upper device surface. Consequently, the support layer can also be used as a sound absorption material which was required conventionally. The support layer may be disposed on a grating reflector or interdigital transducers (IDT) with apotized weighting.

Next, the cover 5b of the space retainer 5 covers the functional portion 2. and the peripheral fringe portion thereof is joined onto the support layer 5a, a hermetically sealed space 20 is formed between the inner surface of the cover and the oscillation surface of the functional portion, and the space is thus hermetically sealed. FIGS. 4 to 8 show examples wherein a cover having a rectangular upper surface is disposed on the support layer so as to form a space forming member.

The cover disposed on the support layer is preferably made of a synthetic resin film. It is particularly preferable that the same resin as that used to form the support layer is used so as to release the effects of joining stress during thermal forming.

The forming of the cover can be best attained by transferring the cover made of a photosensitive synthetic resin film having been separately formed into the shape of a base beforehand on the support layer and by heating under pressure. When the cover made of the film is formed, the photosensitive synthetic resin film is covered by a mask corresponding to the external shape of the cover, light irradiation is carried out over the base to remove unwanted peripheral portions, and the film is separated from the base. The obtained film is then transferred onto the support layer and joined by heating under pressure.

In the cover forming process, as a method other than the transfer method, a lamination method for laminating a resin film for the cover may be used in the same way as the support layer forming process. In this case, to form the support layer, a photosensitive resin sheet or film can be attached to the upper surface of the support layer, and aligned to the external shape of the support layer by patterning. To prevent the cover from warping, the lamination temperature of the cover should preferably be lower than the lamination temperature of the support layer.

In the step of forming the support layer or the cover, when the steps of exposing and developing a photosensitive organic film is carried out, it is preferable that an inorganic thin film made of silicon oxide or the like is formed in the functional portion of the functional device chip in order to protect the functional portion of the chip, particularly to protect the electrodes made of aluminum from being damaged by weak alkaline development liquid. When it is difficult to form an inorganic thin film at the functional portion, it is preferable that a dry film resist of a non-alkaline development type is used.

Figure 5:
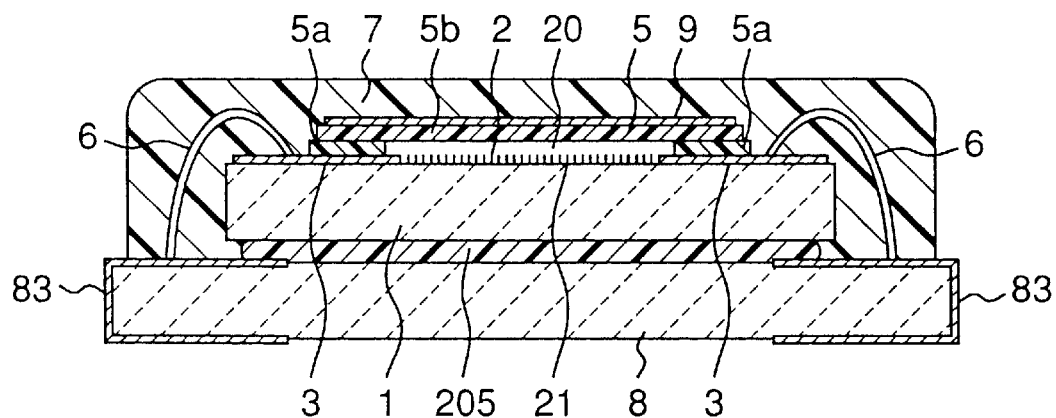
FIG. 5 is a view similar to that of FIG. 1A and shows another embodiment of the present invention.

In case the support layer or cover of the space retainer is made of a synthetic resin, a liquid sealing resin is sealed and thermoset, the resin of the support layer or the cover is reacted with the sealing resin, and then the support layer and the cover in particular may be swelled and deformed. As a result, the deformed and inwardly warped cover may make contact with the oscillation surface of the functional portion, thereby preventing oscillation, and damaging the function of the functional device. In this case, to prevent the chemical reaction between the two, it is preferable that an inorganic thin film made of a stable material, such as a metallic film, or an inorganic thin film made of silicon oxide, silicon nitride or the like is formed as an isolation layer 9 outside the cover 5b as shown in FIG. 5. A metallic isolation layer 9 is a film made of gold, aluminum, nickel, titanium or other metal, a multilayer film or an alloy film.

As the method of forming the metallic isolation layer 9 on the external surface of the cover 5b, a physical forming method by vapor phase deposition, such as the vacuum deposition method, the sputtering method or the ion plating method is preferably used widely. When a nonmetallic inorganic film is formed. the sputtering method can be used appropriately.

In other preferable forming methods, the isolation layer should preferably be formed when the cover made of the synthetic resin film preformed on the separate base is transferred to the support layer in the process of forming the cover. In other words, after the synthetic resin film to be used as the cover and the metallic layer as the isolation layer are simultaneously formed on the film in the lamination condition beforehand, the cover made of a resin film is transferred onto the support layer. The metallic layer is also transferred when the cover is transferred onto the support layer. When the resin film is thermoset, the metallic film is secured to the external surface of the cover, thereby forming the isolation layer.

Since the isolation layer is used to isolate the cover made of an organic material from the sealing resin to be used for sealing later so as to prevent chemical reaction between the two resins. As a result, it is possible to obtain an electronic part having a space holding structure having an appropriate shape even after the sealing resin is thermoset. In addition, the effect of preventing moisture entry to the functional portion can be improved, and the moisture resistance of the functional device can also be improved significantly, thereby enhancing the reliability of the electronic part.

In case a metallic film is used as the isolation layer, it is preferable that the isolation layer is electrically connected to the grounding electrode formed on the functional device chip so that the isolation layer can also function as an electromagnetic shielding film. With this structure, radio frequency waves can be shielded at the functional portion, thereby improving the frequency response of the radio frequency oscillation device.

In case an insulating inorganic film, such as a film made of the above-mentioned silicon oxide, is used as the isolation layer, it is preferable that the isolation layer is formed so as to fully cover the support layer and the front surface and the side surface portions of the cover. With this structure, moisture is prevented from transferring from the sealing resin, thereby completely preventing moisture from entering the functional portion.

It is preferable that the isolation layer comprises two layers: a metal coated layer and a ceramic coated layer so that the metal coated layer can offer an electromagnetic shielding effect and so that the ceramic coated layer can attain complete moisture prevention.

The above-mentioned description applies to a case wherein the space retainer is formed on one main surface of the functional device chip. However, space retainers can be formed on both main surfaces of the chip, just as in the case of a bulk oscillator which is required to have oscillation spaces on two main surfaces of the chip. In such a case, oscillation surfaces are provided on both surfaces of the chip, just as in the case of a crystal oscillator and a ceramic oscillator, for example.

In the functional device chip provided with the space retainer, the space retainer is hermetically sealed by a sealing resin, that is, an insulating thermosetting resin. In case the space retainer is provided with the isolation layer as described above, it is not necessary to worry about reaction between the isolation layer and the resin constituting the space retainer. For this reason, a conventional epoxy or silicon resin can be used.

The functional device chip 1 provided with the space retainer 5 is secured to the circuit substrate 8. A ceramic circuit substrate 8, a synthetic resin circuit substrate or a circuit substrate of a lamination comprising a ceramic resin and a synthetic resin can also used as the circuit substrate. Traditionally, no synthetic resin circuit substrate was used for the oscillation device because the circuit substrate is not moisture-proof. However, a synthetic resin circuit substrate can be used for the present invention, since the space retainer is formed, in particular, the isolation layer is formed to achieve moisture prevention. An alumina circuit substrate is used as a ceramic circuit substrate. A glass-epoxy resin circuit substrate which was not used because it is not moisture-proof, and a resin circuit substrate, such as a glass-epoxy resin circuit substrate or a polyimide circuit substrate, can also be used as a synthetic resin circuit substrate, and can ensure sufficient reliability.

In the case of face-up mounting, when the functional device chip is secured to the circuit substrate, a surface (usually, the back surface of the main surface) other than the main surface, on which the functional portion of the chip is formed, is opposed to the surface of the circuit substrate, and the chip is secured by adhesion via an adhesion layer 205.

In the case of face-down mounting for securing the functional device chip, the circuit substrate is opposed to the space retainer of the functional portion of the chip. The above-mentioned thermosetting sealing resin liquid is filled therebetween, and thermoset to secure the chip.

In the case of face-down mounting, electric connection and conduction is established between the electrode pad of the functional device chip and the electrode pad for wiring on the circuit substrate side. The conduction portion is buried in the sealing resin.

For the electrical connection between the functional device chip and the circuit substrate, a method of connecting the electrode pads by wire bonding, a method of contacting the electrode pads by using metallic conductive bumps, or a method of connecting pads by using cured members made of a conductive resin are used. The wire bonding method is used for face-up mounting, and the pad method is used for face-down mounting.

As an electrode connection member 6 for the pump method, a metallic conductor having a projection portion projected from the electrode pad 3, 83 on the functional device chip side or on the circuit substrate side is used. The tip of the projection portion is directly made contact with the mating electrode pad so as to be secured. In addition, an electrode connection member 6 can be used, wherein a small-diameter projection 61a provided at the tip of the projection portion 6a is directly made contact with the electrode pad 3, 83. At the small-diameter projection provided at the tip of the projection portion, the head portion of a conductive synthetic resin for accommodating the projection is formed by the transfer method so that the head portion is made contact with the mating electrode pad and then cured. This method is also used preferably. Usually, the projection portion of the electrode connection member of the metallic conductor is joined with each electrode pad by ball bonding one end of a gold wire, and each projection portion is prepared at a constant length. In the ball bonding method using gold wires, since the electrode pad of the chip has the projection structure equipped with the small-diameter projection, it is possible to easily control the transfer amount of the adhesive at the head portion of the conductive resin in a later process.

The conductive resin used as the electrode connection member 6 is made by kneading a resin binder with a filler such as an AgPd alloy and other metal powder used as the conductive filler of a conductive adhesive 6b. A phenoxy thermoplastic adhesive, a silicon or epoxy thermosetting adhesive or the like can be used as the resin.

As described above, in the case of face-up mounting, the functional device chip wherein the space retainer for forming a hermetically sealed space at the functional portion is formed on the main surface is mounted while the opposite surface of the main surface are placed so as to face the circuit substrate. Electric connection is established between the chip and the circuit substrate as the electrode connection portion by using wires. Sealing is established containing the space retainer and the electrode connection portion. Consequently, an electronic part is obtained. It is also possible to obtain a mold-type electronic part by mold-forming the entire chip including the space retainer and the electrode connection portion by using a sealing resin.

In the case of face-down mounting, a bump is formed as an electrode connection portion on the electrode pad of the functional device chip or the electrode pad of the circuit substrate. The chip is placed so as to face the circuit substrate, and the bump is joined with another electrode pad of the bump. A sealing resin is filled between the chip and the circuit substrate and thermoset, and at the same time the space retainer is hermetically sealed. Consequently, an electronic part is obtained. In this face-down mounting, it is also possible to obtain a mold-type electronic part by mold-forming the entire chip including the space retainer and the electrode connection portion by using a sealing resin in the same was as described above.

With the present invention, hermetical sealing, moisture prevention in particular can be ensured in the space wherein the functional portion is held by the support layer of the space retainer and the cover. It is possible to directly mount a chip on a circuit substrate, such as a resin circuit substrate, as well as a ceramic circuit substrate. As a result, no package is required, and compact electronic parts can be obtained at low cost. Furthermore, after the space retainer is formed, it is possible to prevent conductive foreign matters from entering the functional portion. For this reason, clean environment is not necessary in the mounting process of the functional device, thereby significantly reducing production cost.

In the above-mentioned explanation, a method of mounting one functional device chip is described. However, a plurality of chips can be arranged and mounted on one circuit substrate, a sealing resin can be charged by one operation, and after this, the circuit substrate can be cut and divided into the basic unit portions of the circuit substrate on which the chips are arranged, as necessary.

Embodiment 1

Figure 1B:
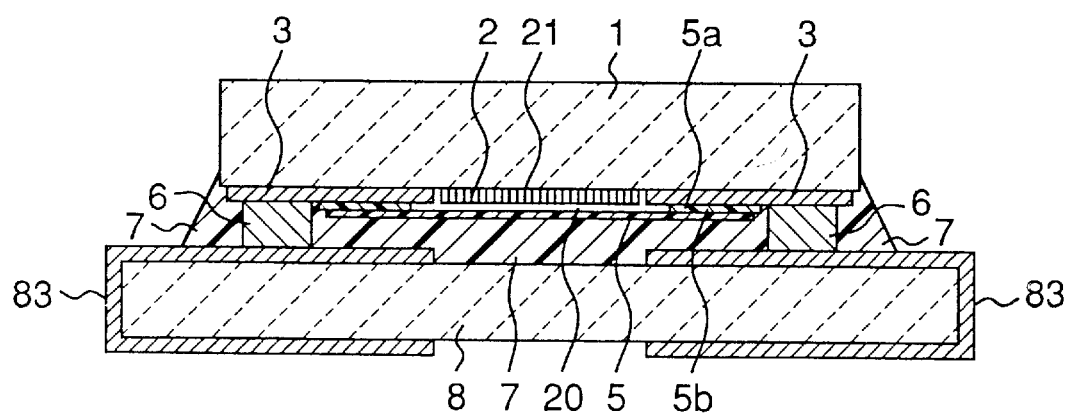
FIG. 1B is a view similar to that of FIG. 1A and shows the face-down mounted electronic part in accordance with the present invention.
Figure 2A:
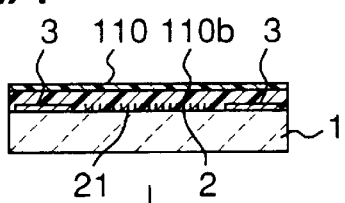
FIGS. 2A–2H show steps of providing the space retainer at the functional portion of the functional device chip in accordance with the present invention.
Figure 2B:
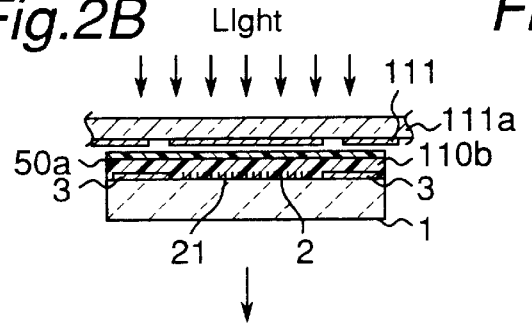
Figure 2C:
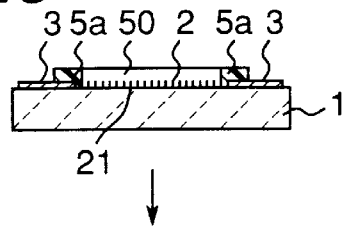
Figure 2D:
Figure 2E:
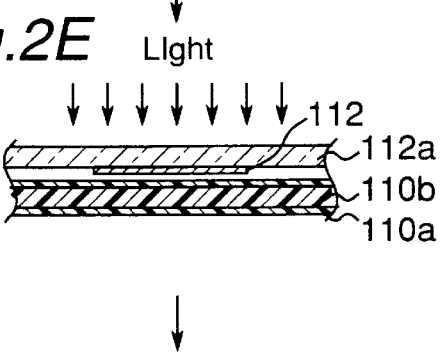
Figure 2F:
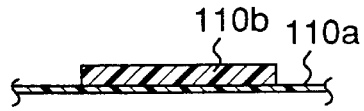
Figure 2G:
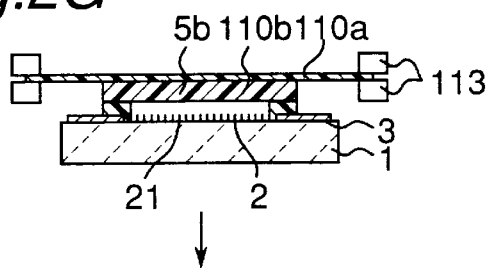
Figure 2H:
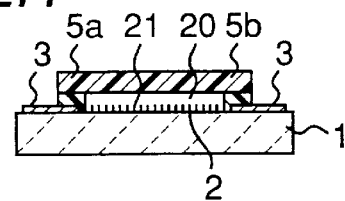

In FIGS. 1A and 1B, an acoustic surface-wave device having a surface-wave propagation surface as a functional portion 2 on a main surface 21 of a functional device chip 1 is shown as an example of an electronic part. In the acoustic surface-wave device 1, a transversal interdigital electrode is formed by using the ordinary photo-lithographic method for the functional portion. The electrode pads 3 for establishing electric conduction with an external circuit outside the functional portion is made of a metallic film mainly consisting of aluminum.

In the electronic part shown in FIG. 1A, the functional device chip 1 is equipped with a space retainer 5 for covering the functional portion 2 and for forming a hermetic space 20 therein. The opposite surface side of the chip 1 faces a circuit substrate 8 and is secured to the circuit substrate by an adhesive layer. The electrode pads 3 on the main surface 21 are connected to the wiring electrode pads 83 of the circuit substrate 8 by wire bonding using gold wires.

First, a method of forming the space retainer comprising a support layer 5a and a cover 5b is described below referring to FIG. 2. The functional portion of the functional device chip 1 provided with the functional portion 2 and the electrode pads 3 is laminated with the photosensitive resin portion 110b of a dry film resist 110 by heating under pressure (FIG. 2-a). The support layer 5a is formed on the chip 1 by conducting exposure by the ordinary exposure method using a photo-mask 111 on a transparent film 111a designed so as to have a partial opening 50 at least at the functional portion 2 and the electrode pads 3 (FIG. 2-b), by conducting development and by carrying out weak alkaline washing, thereby forming the support layer 5a on the chip 1 (FIG. 2-c).

FIG. 3 shows the arrangement of the support layer 5a on the main surface 21. The support layer 5a encloses the interdigital electrode on the main surface 21 at the opening 50 thereof. At the portions intersecting with electrode leads 31, the main surface 21 is joined properly and hermetically to the stepped portions 31 of leads.

Next, a dry film resist 110 is prepared separately. This film resist in its film condition is pattern-formed in the shape of the cover 5b by using a photo-mask 112 on a transparent film 112a designed to cover the opening 50 at the functional portion 2 (FIG. 2-e). The cover 5b is formed on the base film 110a of the dry film resist 110. A base film 113a is held with a frame-shaped clamp jig 113, and an exposure resist 110b having the shape of the cover 5b is transferred onto the support layer 5a by heating under pressure (FIG. 2-g).

Figure 4A:
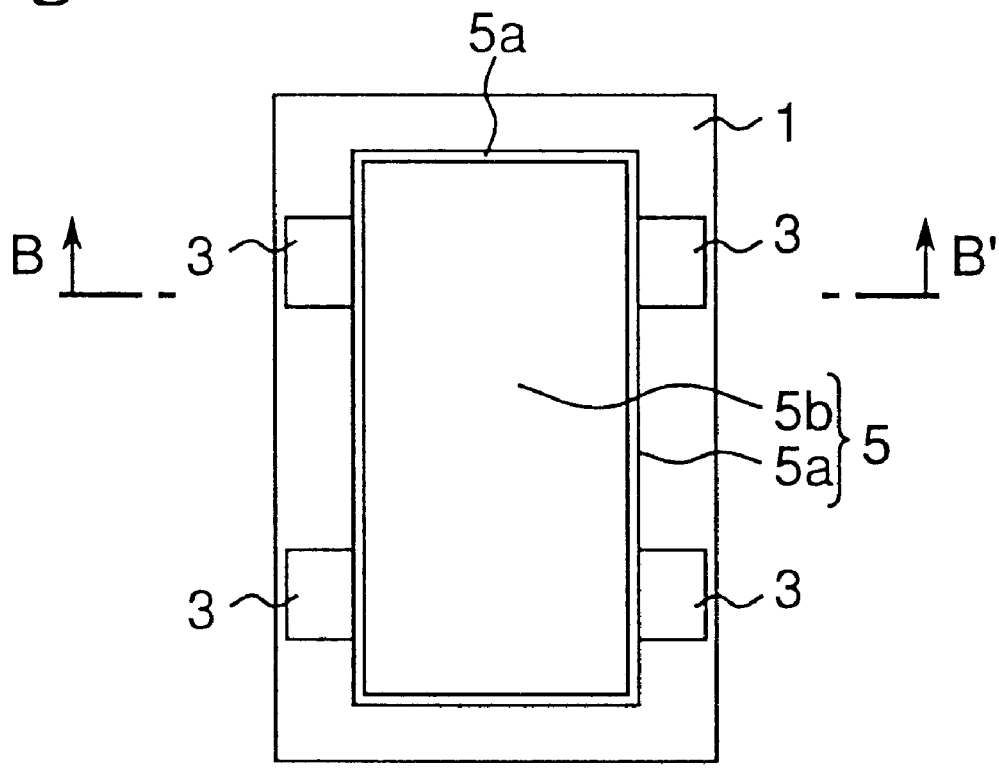
FIGS. 4A and 4B are plan and vertical sectional views showing the structure of the cover of the space retainer in accordance with the present invention, respectively.
Figure 4B:
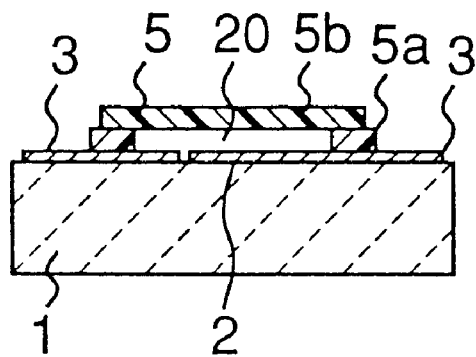

By following the above-mentioned process, the space retainer 5 comprising the support layer 5a and the cover 5b enclosing the functional portion 2 is formed. FIG. 4 shows the arrangement of the space retainer 5 having the film-shaped cover 5b secured to the upper surface of the support layer 5a and used to cover the opening 50 on the functional device chip 1.

As shown in FIG. 1A, the functional device chip 1 having the space retainer 5 comprising the support layer 5a and the cover 5b as described above is secured onto an alumina circuit substrate 8 via an adhesive 205 by face-up mounting, and conduction is established between the chip 1 and the circuit substrate 8 by electrode interconnection portions 6 made of gold wires. Finally, paste of an epoxy sealing resin 7 is piled and applied to the circuit substrate 8 on which the chip 1 has been mounted. By thermosetting the paste. it is possible to obtain an electronic part wherein the space retainer 5 covering the functional portion 2 of the chip 1 is securely hermetically sealed.

FIG. 1B shows an example wherein the functional device chip 1 provided with the space retainer 5 is face-down mounted on the circuit substrate 8. The chip 1 is mounted in the condition that the main surface 21 provided with the space forming member 5 is directed toward the circuit substrate 8, and then connected to the electrode pads 83, 83 of the circuit substrate via the electrode interconnection members 6 having projection portions 6a made of gold wires projecting from the electrode pads 3, 3 of the chip. A clearance is formed between the chip 1 and the circuit substrate 8. A sealing resin is charged into the clearance of the sealing resin so as to secure the chip 1 to the circuit substrate 8.

Embodiment 2

Figure 6:
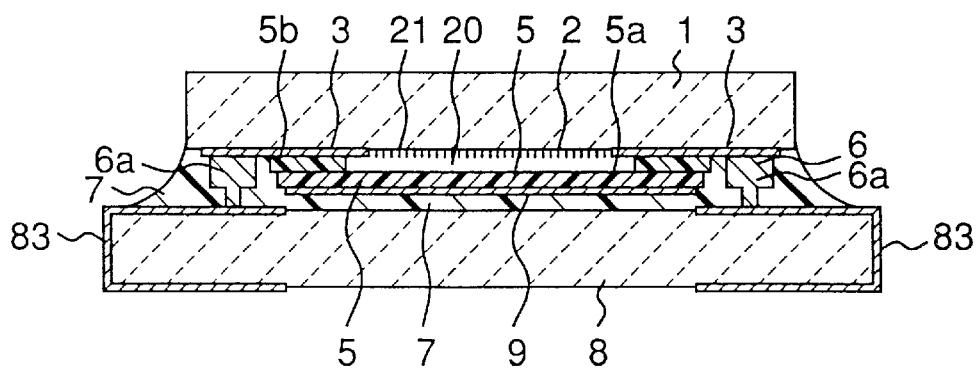
FIG. 6 is a view similar to that of FIG. 1B and shows another embodiment of the present invention.

FIGS. 5 and 6 shows examples of electronic parts wherein the functional device chip thereof is an acoustic surface-wave filter comprising five acoustic surface-wave resonators used as its functional portion 2 on a main surface 21 and connected in a ladder form. In these examples, the chip is face-down mounted on the circuit substrate.

Figure 7A:
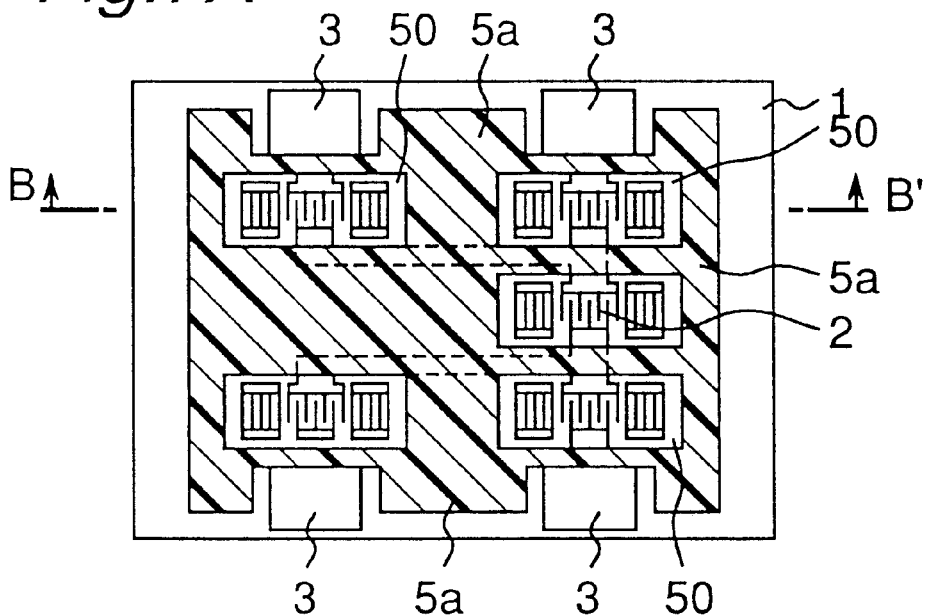
FIGS. 7A and 7B are views similar to FIGS. 3A and 3B and show a space retainer in accordance with another embodiment of the present invention.
Figure 7B:
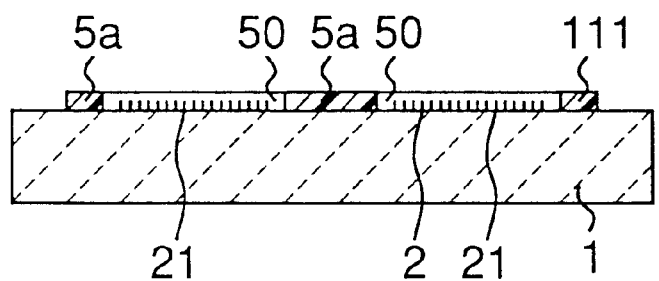
Figure 8A:
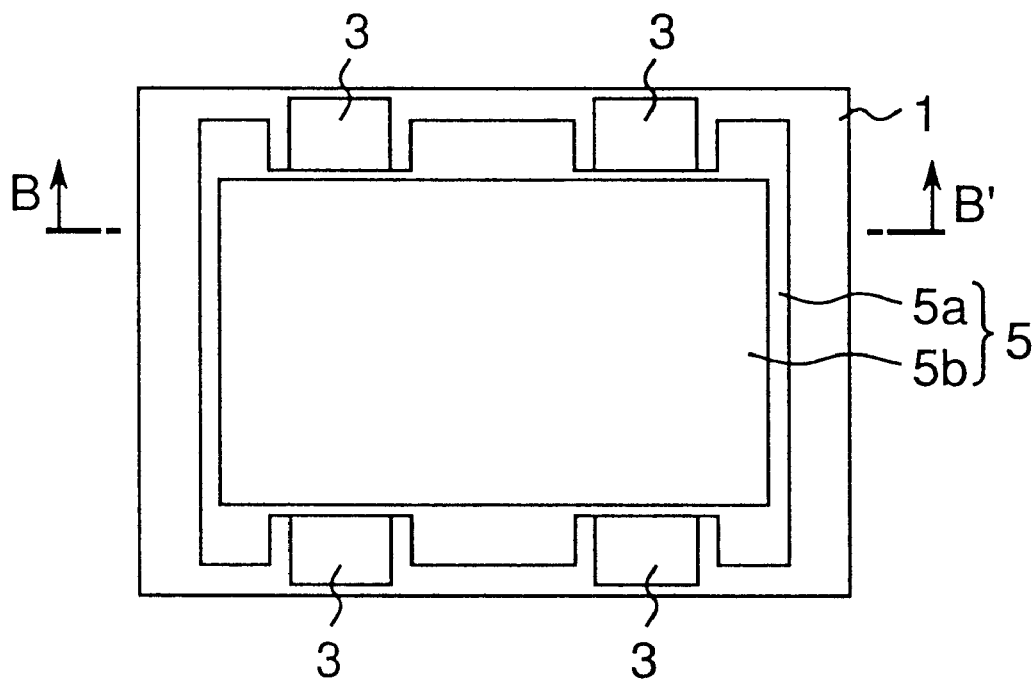
FIGS. 8A and 8B are view similar to FIGS. 4A and 4B and show a space retainer in accordance with another embodiment of the present invention.
Figure 8B:
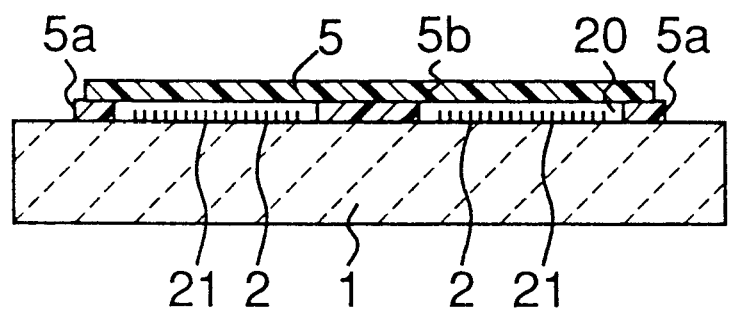

In FIGS. 7 and 8, the support layer 5a of the space retainer 5 is formed in the same way as that described in embodiment 1. In particular, in this example, an opening 50 corresponding to each acoustic surface-wave resonator is provided in a support layer 5a. The cover 5b is a resin film having a shape for blocking all the openings 50 at a time, and then joined onto the support layer 5a by heating under pressure. However, when the lamination method is employed when processing the cover 5b, it is preferable that the support layer 5a is designed so that the area of each opening 50 is reduced in order to minimize the warp of the cover 5b.

Next, before the chip 1 is mounted on the circuit substrate 8, a metallic mask having openings corresponding to the shape of the cover 5b is prepared, and an isolation layer 9 made of a deposition metal film made by the electronic beam deposition method is formed on the outer surface of the cover 5b. FIGS. 5 and 6, sectional views, show the isolation layer 9 provided on the outer surface of the cover 5b of the chip 1 for an electronic part mounted on the circuit substrate 8.

In FIG. 6, by the ball bonding method using gold wires, a conductive projection portion 6a is formed on the electrode pad 3 of the functional device chip 1 to obtain electrode interconnection portions 6. The chip 1 is positioned face-down on the circuit substrate 8. By using both heat and ultrasound, the conductive projection portions 6a are connected to the wiring electrode pads 83 formed on the circuit substrate 8.

In the end, an epoxy sealing resin 7 is charged into the clearance formed between the functional device chip 1 and the circuit substrate 8, and then thermoset so as to obtain an electronic part wherein the functional portion 2 of the chip 1 is securely hermetically sealed.

Figure 9:
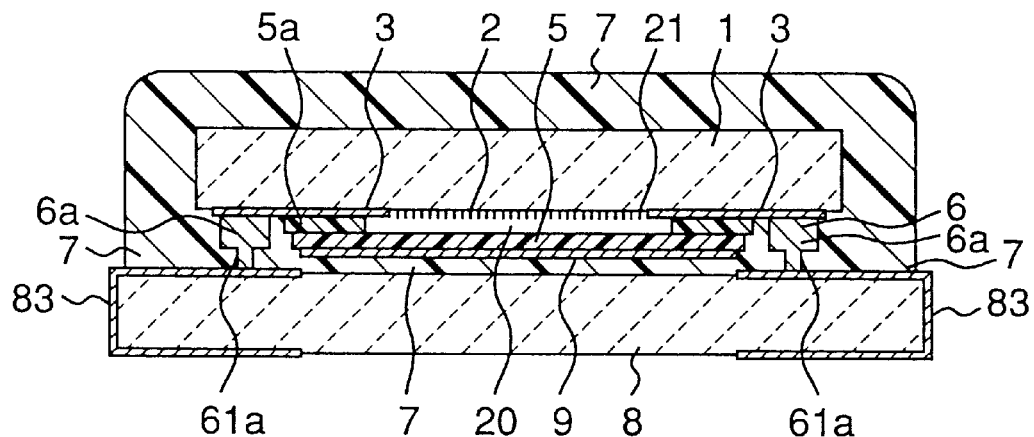
FIG. 9 is a view similar to that of FIG. 1A and shows another embodiment of the present invention.

FIG. 9 shows an example of an electronic part of a resin mold type wherein the sealing resin 7 is charged into the clearance formed between the functional device chip 1 and the circuit substrate 8 and further molded so as to enclose the entire chip 1.

Embodiment 3

Figure 10:
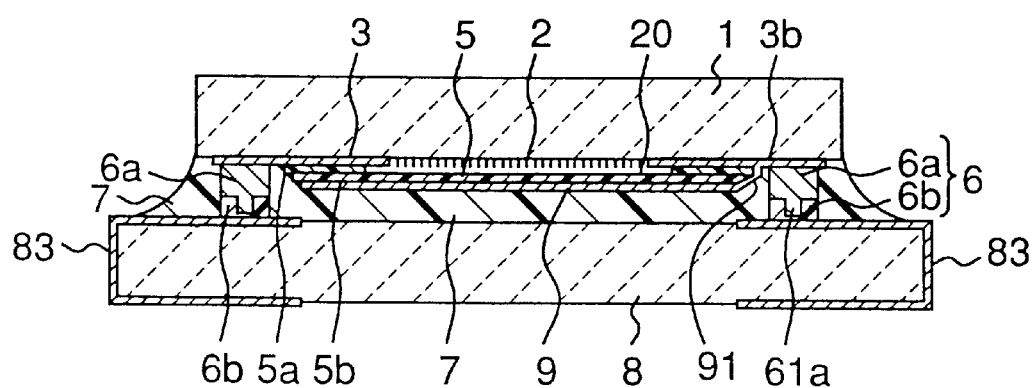
FIG. 10 is a view similar to that of FIG. 1B and shows another embodiment of the present invention.

FIG. 10 shows an acoustic surface-wave device having a functional portion 2 on a main surface 21 of a functional device chip. Electrode pads 3 made of metallic film mainly consisting of aluminum are formed on the chip 1 by using the ordinary photo-lithographic method so as to establish electric conduction between an external circuit and the functional portion 2 having an interdigital electrode. Just as in the case of the embodiment 1, the support layer 5a and the film-shaped cover 5b of a space retainer 5 are formed on the chip 1 by using a dry film resist 110. Next, a metal mask having an opening corresponding to the shapes of the cover 5b and a grounding electrode pad 3a is prepared, and an isolation layer 9 made of aluminum is formed by the sputtering method.

In the isolation layer 9 made of the above-mentioned metal, the isolation layer 91 thereof for covering the support layer 5a and the side surface portion of the cover 5b is electrically connected to a grounding pad 3b. With this structure, the isolation layers 9, 91 are grounded and also work as shielding electrodes.

Furthermore, a conductive projection portion 6a having a two-step projection structure provided with a small-diameter projection 61a is formed on the electrode pad 3 of the functional device chip 1 by the ball bonding method using gold wires. By providing the two-step projection structure at the conductive projection portion 6a, the transfer amount of a conductive adhesive 6b can be controlled easily in the later process. The conductive projection portions 6a are pressed on a mirror-finished base (not shown) so that the plural conductive projection portions 6a formed on the chip 1 can have a uniform height.

Next, the conductive adhesive 6b is transferred to and formed on the conductive projection portion 6a. The transfer and forming of the conductive adhesive 6b is carried out by penetrating the second projection 61a of the conductive projection portion 6a into an epoxy thermoplastic conductive adhesive on the mirror-finished base, having a constant thickness and including an AgPd alloy as a filler, which is applied on the second projection 61a. In the transfer process of the conductive adhesive, the height of the first projection of the conductive projection portion is required to be higher than the sum of the heights of the support layer 5a and the cover 5b. In this embodiment, the height of the first projection of the conductive projection portion 6a is set to 60μm by using a gold wire having a diameter of 50μm. However, even when a dry film resist having a thickness of 20μm just as in the case of the first embodiment, the above-mentioned transfer process can be applied sufficiently.

After this, as shown in FIG. 10, a sectional view after mounting, the functional device chip 1 having the conductive adhesive 6b attached thereto is positioned face-down and placed on the circuit substrate 8 made of a glass-epoxy resin. The conductive adhesive is thermoset to establish conduction to the circuit substrate. The epoxy sealing resin 7 was charged into the clearance formed between the chip 1 and the circuit substrate 8 and was thermoset. Consequently, an electronic part wherein the functional portion 2 of the chip 1 is securely hermetically sealed can be obtained.

Embodiment 4

Figure 11:
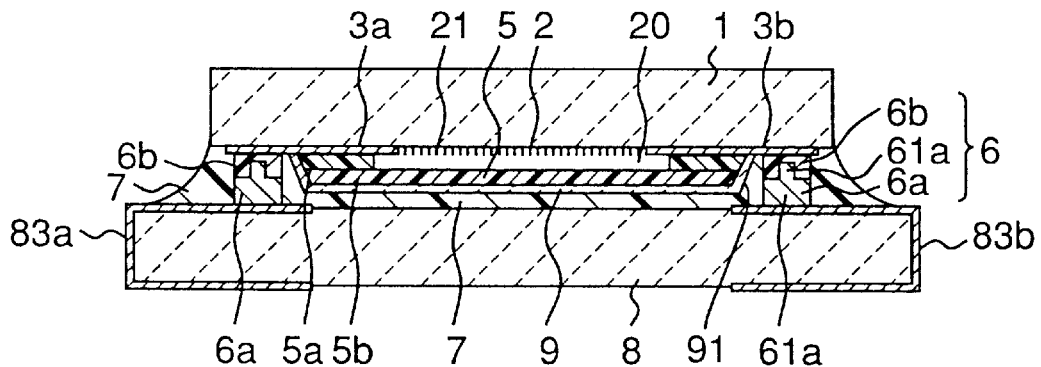
FIG. 11 is a view similar to that of FIG. 1B and shows another embodiment of the present invention.

FIG. 11 shows an example of an acoustic surface-wave device having a functional portion on a surface of a functional device chip.

First, just as in the case of embodiment 1, a support layer 5a and a cover 5b are formed on the functional device chip 1 by using a dry film resist. A metal mask having an opening larger than the cover is prepared, and an isolation layer 9 made of silicon oxide is formed by sputtering. With this structure, the isolation layer 9, 91 made of an insulating inorganic film is made contact with an input/output electrode pad 3a and a grounding electrode pad 3b, and the wall surfaces of the support layer 5a and the cover 5b are covered by the wall sides 91 of the isolation layer 9, thereby enhancing hermetic sealing.

In case the functional device chip 1 having the isolation layer 9 made of an insulating inorganic film is mounted by face-down mounting, the chip does not cause malfunction even when the wiring electrodes and the isolation layer 9 formed on the circuit substrate 8 disposed opposite thereto are made contact with each other.

Furthermore, a conductive projection portion 6a having a two-step projection structure is formed on an electrode pad 83 of the circuit substrate 8 by the ball bonding method using gold wires. By providing the two-step projection structure at the conductive projection portion 6a, the amount of the conductive adhesive 6b can be controlled easily in the later process. The conductive projection portion 6a is pressed on a mirror-finished base so that the plural conductive projection portions 6a formed on the circuit substrate 8 can have a uniform height. Next, the conductive adhesive 6b is transferred to the conductive projection portion 6a. Just as in the case of embodiment 3, the coating and forming of the conductive adhesive 6b is carried out by penetrating the second projection 61a of the conductive projection portion 6a of the circuit substrate 8 into an epoxy thermoplastic conductive adhesive on the mirror-finished base (not shown), having a constant thickness and including an AgPd alloy as a filler, which is applied on the second projection 61a.

The functional device chip 1 having gold films formed on the electrode pads 3a, 3b is positioned so as to face the circuit substrate, and mounted on the circuit substrate 8 coated with the conductive adhesive 6b. The conductive adhesion 6a is then thermoset to establish conduction to the circuit substrate. When the electrode pads 3 of the chip 1 is connected to the conductive adhesive 6b just as in the case of this embodiment, the outermost surfaces of the electrode pads of the chip should preferably be made of gold films.

In this embodiment, the conductive projection portion 6a is formed on the circuit substrate, and the conductive adhesive 6b is applied thereto. Therefore, the height from the main surface 21 of the functional device chip 1 or the electrode pad 3 to the external surface of the cover 5b is not required to be set lower than the height of the first projection of the conductive projection portion. Accordingly, the degree of freedom for selecting the shape of the conductive projection portion 6 or the dimensional shapes of the support layer 5a and the cover 5b.

In the end, an epoxy sealing resin 7 is charged into the clearance formed between the space retainer 5 of the functional device chip 1 and the circuit substrate 8 and thermoset so that the functional portion 2 of the chip 1 is securely hermetically sealed by the sealing resin 7, and at the same time, the electrode interconnection portions 6 of this electronic part are embedded.

As described above, in the electronic part comprising the conductive projection portions for establishing electric connection between the chip and the circuit substrate, the electrode interconnection portions made of the conductive adhesive, and the sealing resin for covering at least the support layer, the cover and the electrode interconnection portions, the conductive projection portions are formed on the circuit substrate. With this structure, the application of the conductive adhesive by transfer can be carried out easily irrespective of the shape of bumps or the height of the cover. As a result, a highly reliable electronic part can be obtained.

Embodiment 5

Figure 12:
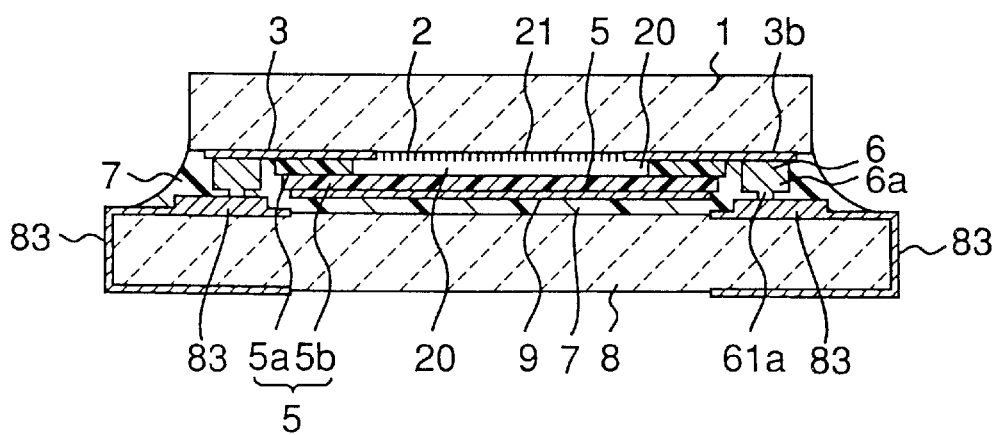
FIG. 12 is a view similar to that of FIG. 4B and shows a another embodiment of the present invention.

FIG. 12 shows an example of an acoustic surface-wave device having a functional portion on a main surface 21 of a functional device chip. Just as in the case of embodiment 1, a support layer 5 and a cover 5b are formed on the chip 1. An isolation layer 9 made of aluminum is formed on the external surface of the cover. Just as in the case of embodiment 2, electrode interconnection portions 6 comprising conductive projection portions having a two-step projection structure is provide on electrode pads 3 formed on the chip 1. The chip 1 is then positioned face-down on a circuit substrate 8. Connection is established between the conductive projection portions and wiring electrodes 83 formed on the circuit substrate 8 by using both heat and ultrasound. The electrode pads 83 formed on the circuit substrate 8 and connected to the electrode interconnection portions 6 are made thicker than other electrode patterns by about 20 μm.

Finally, an epoxy sealing resin 7 is charged into the clearance formed between the functional device chip 1 and the circuit substrate 8, and thermoset to obtain an electronic part.

In this embodiment, since the layers of the electrode pads 83 are made thick, the clearance between the cover 5b and the circuit substrate 8 to be charged with the sealing resin can be obtained sufficiently. Therefore, the insulating resin 7 can quickly penetrate the space formed by the functional device chip 1 and the circuit substrate 8. As a result, the charging time of the sealing resin can be shortened significantly, thereby improving productivity and reducing production cost.

Embodiment 6

Figure 13A:
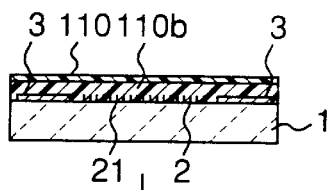
FIGS. 13A–13I are views showing steps of forming the space retainer and an isolation layer at the chip functional portion of the functional device chip in accordance with another embodiment of the present invention.
Figure 13D:
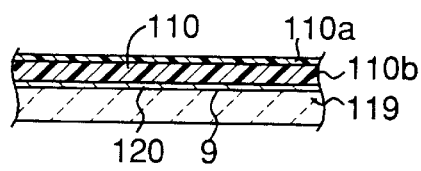
Figure 13B:
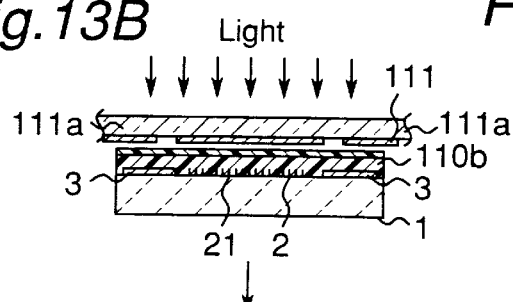
Figure 13E:
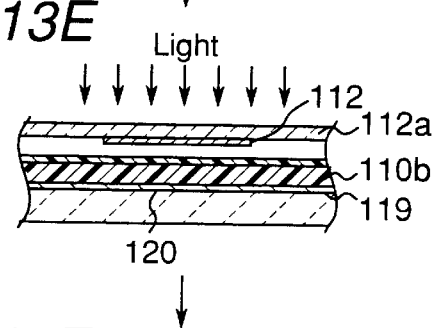
Figure 13C:
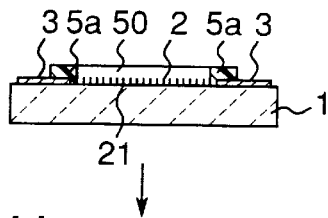
Figure 13F:
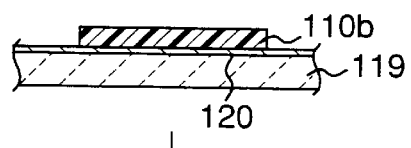
Figure 13H:
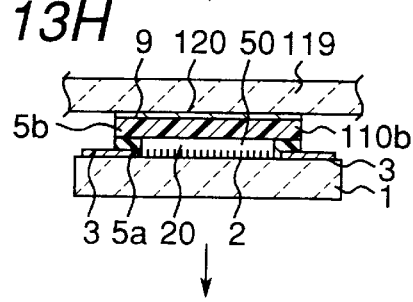
Figure 13G:
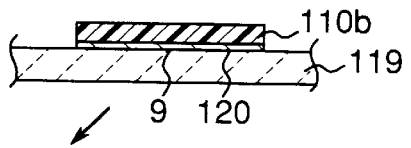
Figure 13I:
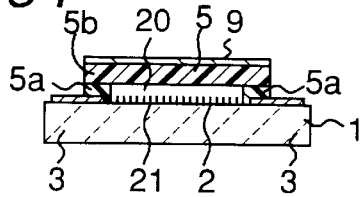

FIGS. 13A–13I are schematic views showing a space retainer forming process for forming an isolation layer 9 and the cover 5b of a space retainer 5 at the same time. First, a support layer 5a is formed on a functional device chip 1 provided with a functional portion 2 and electrode pads 3 (FIGS. 13a to 13c). Up to this step, the forming process is the same as that of embodiment 1.

Next, a gold film 120 having a thickness of about 300 nm is formed on a base 119 made of a quartz crystal piece prepared separately from the functional device chip 1.

The photosensitive resin film 110b of a dry film resist 110 is laminated on a base 119 provided with the metallic film 120 (FIG. 13-d). The cover 5b is then formed from the photosensitive resin film 110b on the metallic film 120 by the ordinary exposure method by using a photo-mask 112 designed to block the opening of the support layer 5a (FIG. 13-f). The metallic film 120 is then removed by etching using the cover 5a as a mask, thereby obtaining the isolation layer 9 (FIG. 13-g).

Furthermore, the base 119 provided with the isolation layer 9 and the cover 15b is positioned so as to face the functional device chip 1 provided with the support layer 5a (FIG. 13-h). The cover 5b is transferred onto the support layer 5a by applying heat and pressure. At this time, since the contact force between the base 119 and the isolation layer 9 is very weak, the isolation layer 9 is transferred onto the support layer 5a while being attached onto the back surface of the cover 5b (FIG. 13-i).

In this embodiment, since the adhesion force between the base 119 and the metallic film 120 is weaker than the adhesion force between the support layer 5a and the cover 5b, the cover 5b having no warp and provided with the isolation layer 9 on its back can be formed on the support layer 5a formed on the functional device chip 1. This process of forming the space retainer 5 can also be used to form a space retaining structure for a device having functional portions 2, 2 on both side of the chip 1, such as a crystal oscillator.

As described above, by using the space retaining structure production method wherein the metallic film and the cover are integrally transferred to the support layer, the cover can be prevented from being warped, thereby obtaining a space retaining structure having a proper shape around the functional portion of the functional device chip, and providing improvement in yield of the functional device. Although a quartz crystal is used for the base in this embodiment, it is possible to use a glass circuit substrate or a single-crystal oxide circuit substrate. In addition, other metals can also be used for the metallic film 120 if such metals have a weak affinity for oxygen and if the adhesion force between the base 119 and the metal is weak. In case the adhesion force between the base and the metallic film is controlled, an intermediate layer made of chromium, titanium, aluminum, nickel, silicon or the like can also be used.

Embodiment 7

FIGS. 14A–14I are schematic views showing a space retainer 5 forming process for forming both an isolation layer 9 and a cover 5b at the same time just as in the case of embodiment 6. First, a support layer 5a is formed on a functional device chip 1 provided with a functional portion 2 and electrode pads 3 (FIGS. 13a to 13c). Up to this step, the forming process is the same as those of embodiments 1 and 6.

Next, a metallic film made of gold and having a thickness of about 300 nm is formed on the base 119 made of a quartz crystal piece prepared separately from the functional device chip 1. The metallic film 120 is pattern-formed by using a liquid photoresist 111b for the ordinary photo-exposure method and also by using a photo-mask (not shown) designed to block at least a part of the opening of the support layer 5a so as to obtain the isolation layer 9 (FIG. 14-d). In this embodiment, the metallic film 120 is pattern-formed after the metallic film 120 is formed on the entire surface of the base. However, the metallic film 120 can be formed on the isolation layer 9 by the lift-off method.

In the next place, a dry film resist 111 is laminated on the base 119 provided with the isolation layer 9 (FIG. 14-e). Like the pattern formation of the isolation layer 9, the cover 5b is formed on the isolation layer 9 by the ordinary exposure method by using a photo-mask 115 designed to block the opening 20 of the support layer 5a (FIG. 14-g).

The base 119 provided with the isolation layer 9 and the cover 5b is positioned so as to face the functional device chip 1 provided with the support layer 5a (FIG. 14-h), and heated under pressure, thereby transferring the cover 5b onto the support layer 5a. Since the adhesion force between the base 119 and the isolation layer 9 is weakened significantly to facilitate separation at this time, the isolation layer 9 can be transferred onto the support layer 5a while the isolation layer 9 remains attached to the back surface of the cover 5b (FIG. 14-i).

Although a quartz crystal was used for the base 119, glass, a single crystal of another oxide or the like can also be used. In addition, although gold was used for the metallic film, other metals can also be used for the metallic film if such metals have a weak affinity for oxygen and if the adhesion force between the base and the metal is weak. Furthermore, in case the adhesion force between the base and the metallic film is controlled, an intermediate layer made of chromium, titanium, aluminum, nickel, silicon or the like can also be used.

In this embodiment, since the adhesion force between the base and the metallic film is weaker than the adhesion force between the support layer and the cover, it is possible to form the cover 5b, which is provided with the isolation layer 9 on the back surface thereof, on the support layer 5a formed on the functional device chip 1. Consequently, it is possible to obtain a space retaining structure having a proper shape. However, in case the pattern formation of the metallic film is performed earlier than the pattern formation of the cover 5b, a certain level of adhesion force is necessary between the base and the metallic film, and it is preferable that a second metallic film having a strong affinity for oxygen is formed as an intermediate metallic film. The second metallic film should preferably be made of a metal selected from a group consisting of chromium, titanium, nickel, aluminum and silicon, or should preferably be a multilayer film made of these metals.

As described above, by using the space retaining structure formation method wherein the metallic film and the cover are integrally transferred to the support layer, the cover can be prevented from being warped, thereby obtaining a space retaining structure having a proper shape around the functional portion of the functional device chip, and providing improvement in yield of the functional device.

Embodiment 8

Figure 15:
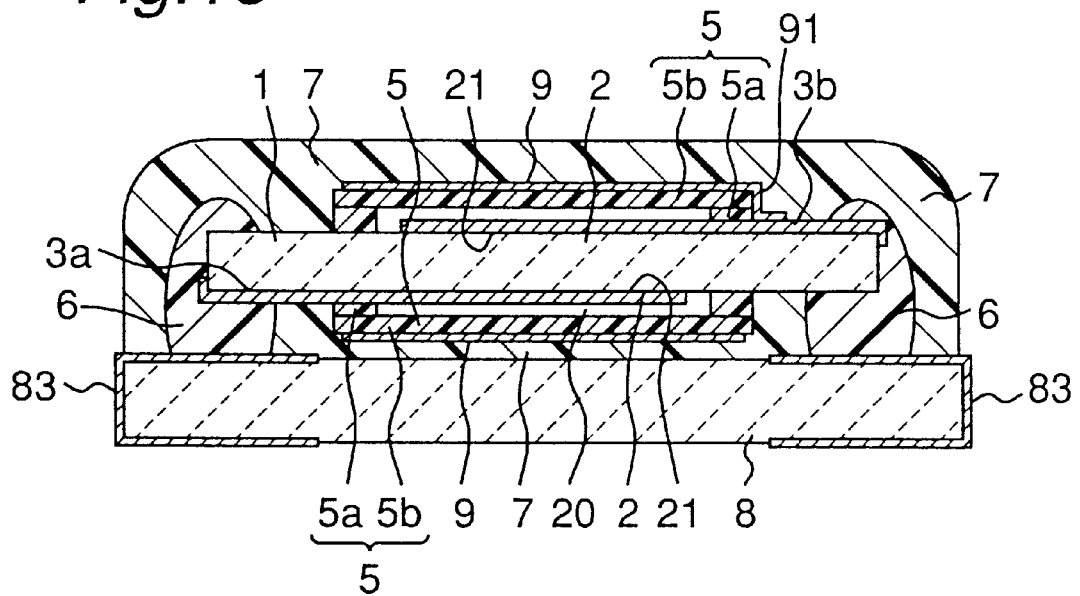
FIG. 15 is a view similar to that of FIG. 1A and shows another embodiment of the present invention.

In this embodiment, a crystal oscillator having functional portions 2, 2 used as oscillation surfaces provided on the two main surfaces 21, 21 on the top and bottom sides of the functional device chip 1 is used as an electronic part as shown in FIG. 15. Electrode pads 3a, 3b for establishing electric conduction between an external circuit and the functional portions 2 provided with excitation electrodes are made of a metallic film including gold as a main ingredient and formed on the two opposite main surfaces 21 of the chip 1.

First, just as in the case of embodiment 1, the support layer 5a and the cover 5b of a space retainer are formed on both the main surfaces 21, 21 of the functional device chip 1 by using a dry film resist. A metal mask having an opening corresponding to the shape of the cover 5a is prepared, and an isolation layer 9 made of a gold film is formed by the electronic beam deposition method. A grounding electrode pad 3b is formed on a main surface 21 of the chip 1, and the isolation layer 9 on the main surface 21 is electrically connected to the grounding electrode 3b.

Next, the functional device chip 1 provided with the space retainers 5 is adhered and secured to wiring electrode pads 83, 83 on a circuit substrate 8 via electrode interconnection portions 6 made of a conductive adhesive. Furthermore, the entire chip is covered by molding a sealing resin 7, thereby obtaining an electronic part of a resin mold type.

Finally, the sealing resin 7 is thermoset. Consequently, it is possible to obtain an electronic part wherein the functional portion 2 of the functional device chip 1 is securely hermetically sealed.

Although the electrode interconnection portions 6 are made of a conductive adhesive in the case of the functional device chip 1 having the functional portions 2, 2 on both the main surfaces 21, 21 thereof in this embodiment, the same electric connection can also be obtained even when conductive projection portions 6a are used.

Embodiment 9

Figure 16:
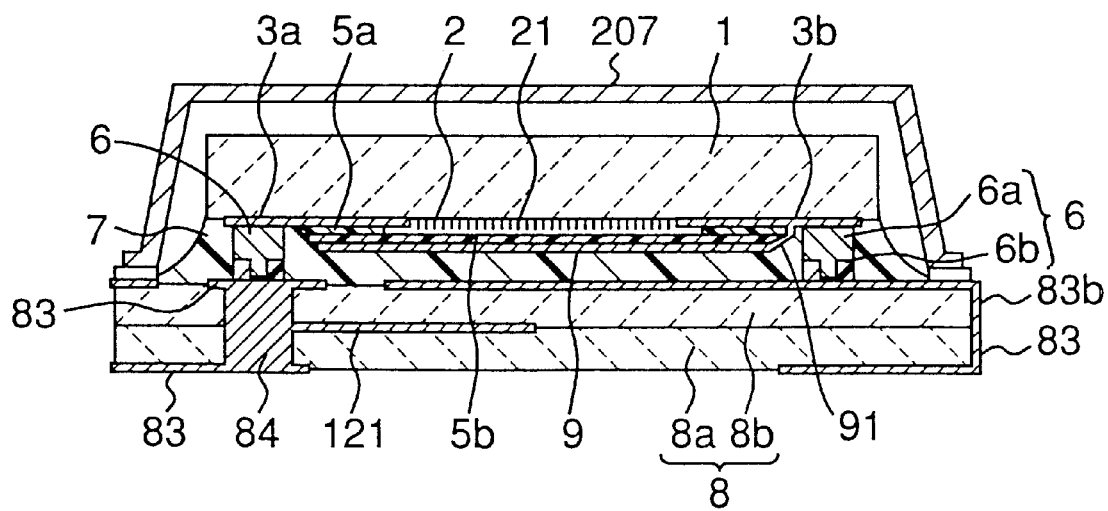
FIG. 16 is a view similar to that of FIG. 1A and shows another embodiment of the present invention.

FIG. 16 shows an acoustic surface-wave device having a functional portion 2 on a main surface 21 of a functional device chip 1, as an electronic part. Electrode pads 3 for establishing electric conduction between the functional portion 2 provided with an interdigital electrode and an external circuit are formed on the chip 1 by metallic films mainly consisting of aluminum by using the ordinary photolithographic method. A ceramic multilayer circuit substrate is used for the circuit substrate 8 of the device. At the circuit substrate 8, a passive device 121 is preformed in the inner layers of the ceramic multilayer circuit substrate.

First, just as in the case of embodiment 1, the support layer 5a and the cover 5b of a space retainer 5 are formed on the functional device chip 1 by using a dry film resist. An isolation layer 9 made of aluminum is formed on the cover 5a by the vacuum deposition method, and the isolation layer is electrically connected to a grounding electrode pad 3b. Conductive projection portions 6a each having a two-step structure are formed on the electrode pads 3a, 3b by the ball bonding method using gold wires. The plural conductive projection portions 6a formed on the circuit substrate 8 are adjusted to have a uniform height on a mirror-finished base. Just as in the case of embodiment 3, a phenoxy thermoplastic conductive adhesive 6b wherein an AgPd alloy having a constant thickness is used as a filler is transferred and applied to the projection of the conductive projection portion 6a. The chip 1 coated with the conductive adhesive 6b is positioned so as to face the circuit substrate. The conductive adhesive is thermoset so as to establish conduction to the circuit substrate. In this embodiment, the passive device 121 is preformed in the internal layers of the ceramic multilayer circuit substrate of the circuit substrate 8 so as to establish electrical connection to the chip 1.

In the end, an epoxy sealing resin 7 is charged into the clearance formed between the chip 1 and the circuit substrate 8, and thermoset, thereby obtaining an electronic part wherein the functional portion 2 of the chip 1 is securely hermetically sealed.

In this embodiment, since the circuit substrate comprises two dielectric circuit substrate layers 8a, 8b, it is possible to include in the passive device 121 therebetween. After the support layer and the cover are formed, it is possible to prevent conductive foreign matters from entering the functional portion. Therefore, no clean environment is required in the process of mounting the functional device chip or in the process of mounting passive and active devices, other than the chip, on a circuit substrate on which the chip has been mounted as a bare chip, thereby significantly reducing production cost.

In this embodiment, a metallic protection cap 207 is provided on the circuit substrate 8 to cover the chip 1. The protection cap 207 is electrically connected to the grounding electrode 83b formed on the circuit substrate. With this structure, the functional portion 2 of the chip 1 can have higher moisture resistance and higher radio frequency shielding performance. Instead of a metal, a molded moisture-proof resin, such as a molded liquid-crystal resin, can also be used.

Embodiment 10

Figure 17:
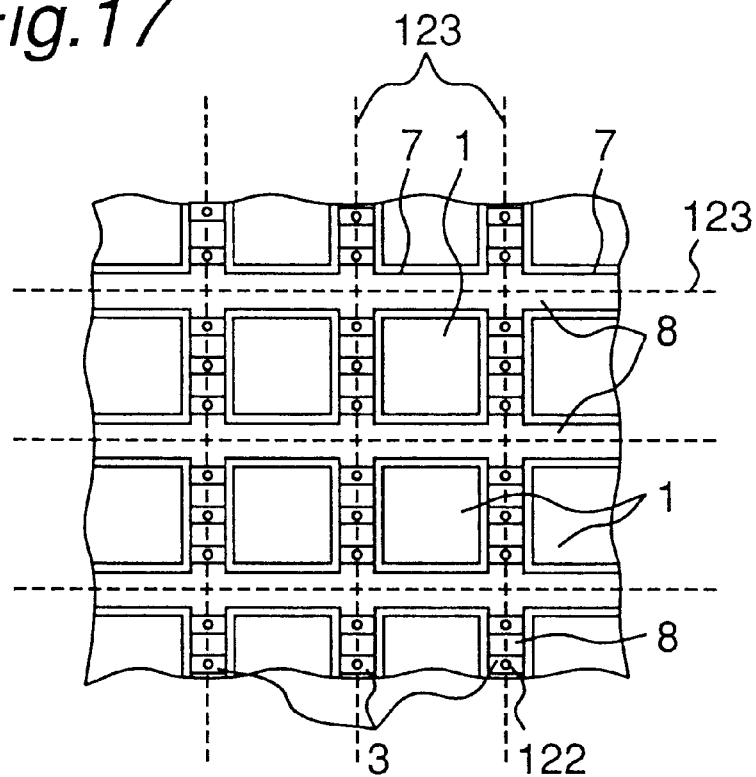
FIG. 17 is a partial plan view of a plurality of electronic parts arranged and mounted on a circuit substrate in accordance with another embodiment of the present invention.

FIG. 17 shows an example of electronic parts, wherein a plurality of functional device chips 1, 1 are arranged and mounted on a circuit substrate 8, and the circuit substrate 8 is made dividable by cutting the circuit substrate 8 along the boundaries of the chips 1, 1. Just as in the case of the above-mentioned embodiment, a functional portion 2, electrode pads 3, and the support layer 5a and the cover 5b of a space retainer 5 are formed on the main surface 21 of each chip 1, although they are not shown. Electrode interconnection portions 6 are formed on the electrode pads 3 formed on the chip or electrode pads formed on the circuit substrate 8. A plurality of chips 1, 1 are arranged at predetermined positions on the circuit substrate 8 via the electrode interconnection portions 6, and secured by a sealing resin. The chips are secured by charging and curing an insulating sealing resin 7 at predetermined positions on the large circuit substrate 8 wherein unit circuit substrate portions are arranged in two dimensions via the electrode pads 3 connected by through holes 122.

The circuit substrate is divided to obtain individual chips 1 by cutting the circuit substrate along cutting lines 123 between adjacent chips 1, 1 together with the through holes 122. With this configuration, even compact electronic parts can be handled easily, since they are secured on the large circuit substrate 8. Furthermore, each process can be carried out for all chips, thereby significantly increasing productivity.

The method of arranging a plurality of the functional device chips 1, 1, in particular a large number of the chips 1, 1 on the relatively large circuit substrate 8 is also applicable when an electronic part comprises a combination of a plurality of chips 1 or when a module is made by combining a functional device with other passive and active devices.

Embodiment 11

Figure 18:
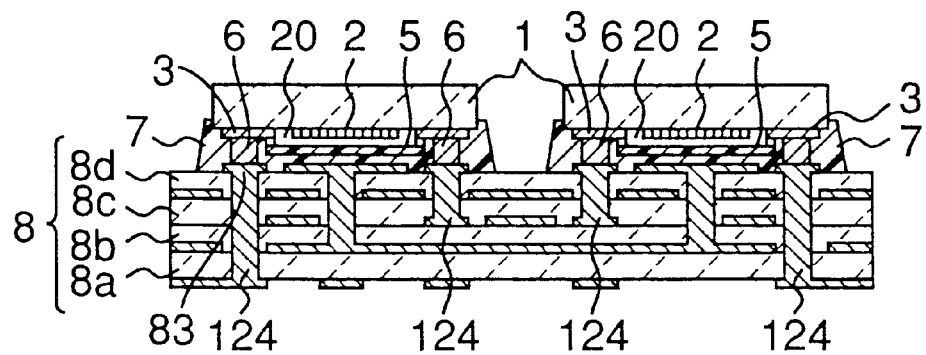
FIG. 18 is a sectional view showing an electronic part with functional device chips mounted on a multi-layer circuit substrate in accordance with another embodiment of the present invention.

FIG. 18 is a schematic view showing the structure of an electronic part wherein two functional device chips are mounted on a multilayer circuit substrate. In this embodiment, a plurality of functional device chips 1 are mounted on a circuit substrate 8 comprising dielectric circuit substrate layers 8a to 8d by the same mounting method as that of embodiment 1. In the circuit substrate 8, electrodes disposed among the layers are connected to one another by via holes 124 passing through the circuit substrate layers 8a, 8b, 8c and 8d, and also connected to the conductive projection portions of the electrode interconnections of the chips. Various circuit devices formed by strip lines or open tabs are built in among the circuit substrate layers so as to match the impedance values of the chips to those of external circuits. In this embodiment, semiconductor devices or other active devices other than the functional devices can be mounted by one operation, although such devices are not shown. Consequently, various complex modular structures can be obtained.

Furthermore, by integrally mounting one or more functional device chips together with other passive or active devices, it is possible to obtain a variety of compact complex modules at low cost. Moreover, by using a circuit substrate having a dielectric multilayers, various passive devices can be built in the circuit substrate. This makes it possible to obtain electronic parts being compact in size, high in performance and low in cost.

Besides, after a space retainer 5 comprising a support layer and a cover is formed, it is possible to prevent conductive foreign matters from entering the functional portion. Therefore, no clean environment is required in the process of mounting the functional device chips or in the process of mounting passive and active devices, other than the chips, on a circuit substrate on which the chips have been mounted as bare chips, thereby significantly reducing production cost.

Embodiment 12

Figure 19:
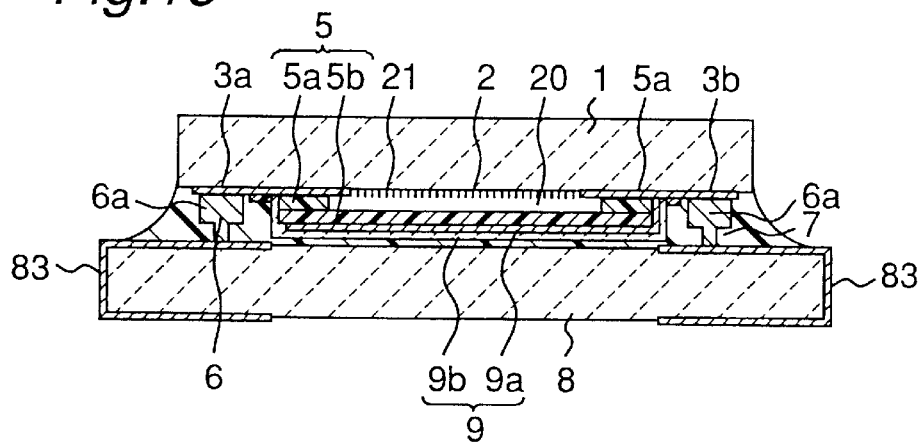
FIG. 19 is a view similar to that of FIG. 1B and shows another embodiment of the present invention.
Figure 20:
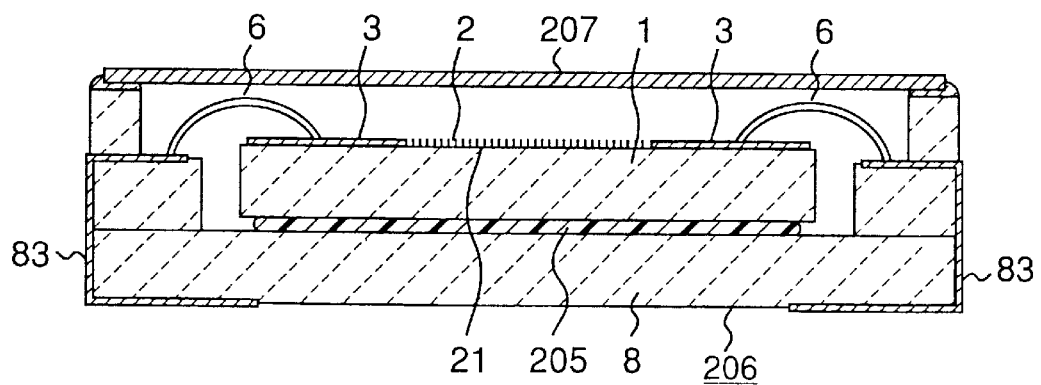
FIG. 20 is a sectional view showing a structure of a conventional electronic part.
Figure 21:
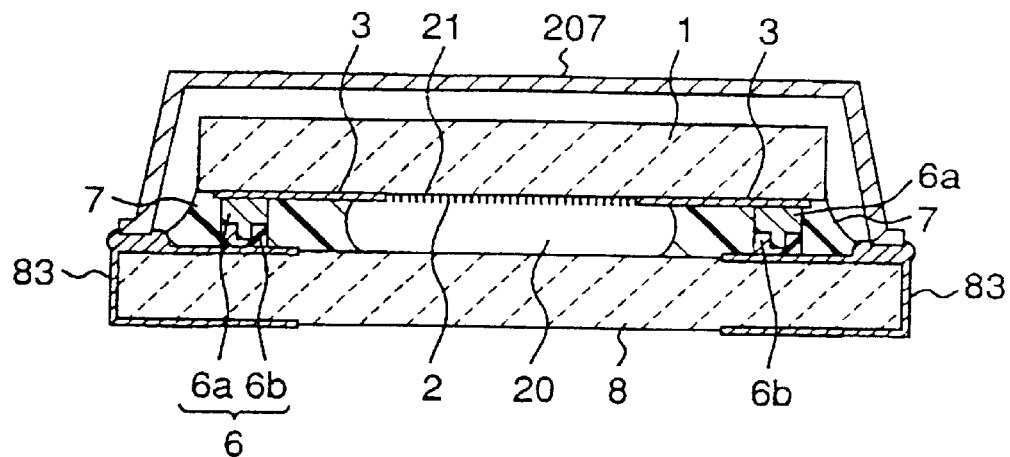
FIG. 21 is a sectional view showing another structure of a conventional electronic part.
Figure 22:
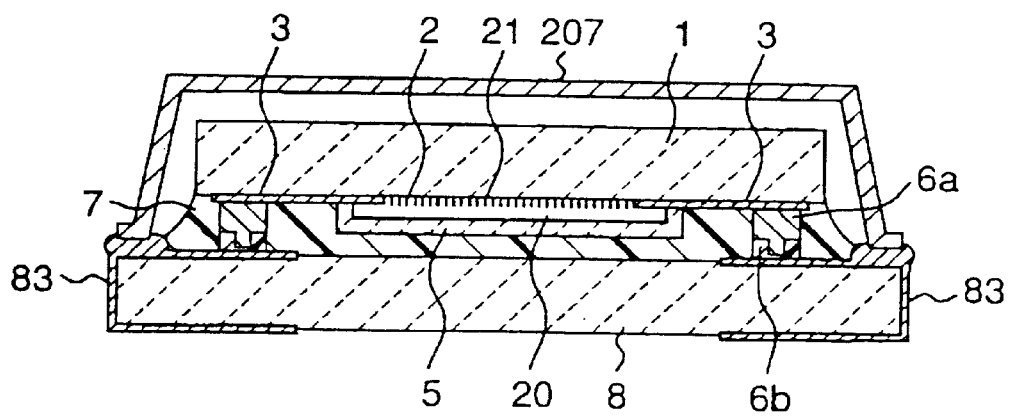
FIG. 22 is a sectional view showing another structure of a conventional electronic part.

FIG. 19 shows an acoustic surface-wave device having a functional portion 2 on a main surface of a functional device chip 1. A space retainer 5 made of a resin film and comprising a support layer 5a and a cover 5b is formed on the chip 1 by using a dry film resist. A metal mask having an opening larger than the external surface shape of the cover 5b is prepared, and a first isolation layer 9a made of an aluminum film is formed by the sputtering method. The first isolation layer 9a is connected to a grounding electrode 3b so as to be used as a radio frequency shield. A second isolation layer 9b, which is an insulating layer made of silicon oxide, is formed on the first isolation layer 9a by the sputtering method. The second isolation layer 9b made of an insulating inorganic film completely covers the first isolation layer 9a and makes contact with an input/output electrode pad 3a and the grounding electrode pad 3b. Furthermore, the wall surfaces of the support layer 5a and the cover 5b are also covered, thereby enhancing hermetic sealing and perfecting moisture resistance. This ensures the stability of the space retainer 5 against a sealing resin to be applied to the second isolation layer 9b later.

After the second isolation layer 9b is formed, conductive projection portions 6a are formed on the electrode pads 3 of the functional device chip 1 so as to obtain electrode interconnection portions 6 by the ball bonding method using gold wires. The chip 1 is positioned face-down on a circuit substrate 8. The conductive projection portions are connected to wiring electrode pads 83 formed on the circuit substrate 8 by using both heat and ultrasound. In the end, an epoxy sealing resin 7 is charged into the clearance formed between the chip 1 and the circuit substrate 8, and the thermoset. Consequently, it is possible to obtain an electronic part wherein the functional portion 2 of the chip 1 is securely hermetically sealed.

As detailed above, in the electronic part of the present invention, a space retainer for providing a sealed space at the functional portion of a functional device chip comprises a support layer, which is made of a synthetic resin, has an opening enclosing the functional portion and is joined onto the main surface of the chip, and a cover, which covers the functional portion so as to provide a hermetically sealed space between the cover and the functional portion, is formed on the support layer by joining. The sealed space at the functional portion can thus be hermetically sealed. Therefore, the chip can be directly mounted on a circuit substrate. As a result, it is possible to obtain a highly reliable electronic part which does not require any container-shaped package.

Furthermore, in the electronic part of the present invention, an isolation layer made of a metallic film and/or an insulating inorganic material is formed on the external surface of the space retainer. With this structure, reaction between a sealing resin used to hermetically seal the space retainer and a resin constituting the space retainer is avoided, thereby preventing malfunction which may occur when the space retainer is deformed by swelling. In addition, electromagnetic shielding is provided so as to improve radio frequency characteristics, and the interior of the space retainer has higher moisture resistance. Consequently, it is possible to obtain an electronic part having far higher reliability.

The electric connection between the functional device chip and the circuit substrate is accomplished by using electrode interconnection portions implemented by conductive projection portions projecting from the electrode pads of the chip or the circuit substrate. With this structure, the clearance between the chip and the circuit substrate can be adjusted easily. The charging of the sealing resin and the mounting of the chip by curing the sealing resin can be carried out very easily, quickly and securely. It is thus possible to obtain an electronic part being superior in productivity and reliability.

In the electronic part production method of the present invention, the process of forming the space retainer comprises a step of forming a support layer used to enclose the functional portion of the functional device chip by forming an opening from a synthetic resin film or a deposition inorganic film, and a step of forming a cover made of a synthetic resin on the support layer. The step of forming the support layer and the cover is accomplished by pattern-forming a photosensitive resin film. Therefore, the support layer and the cover can be formed and joined very accurately, and the joint portion can have high hermeticity. Therefore, the space at the functional portion can be hermetically sealed, and the chip can be directly mounted on the circuit substrate. As a result, it is possible to obtain a highly reliable electronic part which does not require any container-shaped package.

The isolation layer on the external surface of the space retainer can be formed at the time when the cover is formed by the method of pattern-forming a photosensitive film. This is advantageous since the isolation layer can be formed accurately and quickly.

The functional device chip provided with the above-mentioned space retainer in accordance with the present invention is stable even when exposed to a sealing resin and moisture. For this reason, the chip can be mounted on a circuit substrate easily by both the face-up and face-down mounting methods. In addition, it is possible to easily produce an electronic part of a resin mold type by using a sealing resin, or an electronic part of a package type by using a protection cap.

We claim:

1. An electronic part comprising:
    a functional device chip having a functional portion on at least one main surface thereof,
    a space retainer for forming a sealed space at said functional portion of said chip,
    a circuit substrate to which said chip is secured,
    electrode interconnection portions for establishing electric connection between said chip and said circuit substrate, and
    a sealing resin for covering and sealing at least said space retainer, wherein
    said space retainer comprises a support layer made of a synthetic resin film, provided with an opening enclosing said functional portion and joined onto said main surface, and a cover formed and joined onto said support layer so as to cover said functional portion and form a sealed space between said cover and said functional portion.

2. An electronic part according to claim 1, wherein said functional device is a piezoelectric oscillation device having an oscillation surface of said functional portion of said chip.

3. An electronic part according to claim 1, wherein said functional device chip is adhered and secured to said circuit substrate via an adhesive in the condition that a surface opposite to the said main surface provided with said functional portion is disposed to face said circuit substrate.

4. An electronic part according to claim 1, wherein said functional device chip is secured to said circuit substrate via said sealing resin in the condition that said main surface provided with said functional portion is disposed to face said circuit substrate.

5. An electronic part according to claim 1, wherein said support layer is a photosensitive resin film pattern-formed on said main surface.

6. An electronic part according to claim 1, wherein said support layer is made of a film of resin applied to said main surface by printing and then cured.

7. An electronic part according to claim 1, wherein said support layer is a semi-cured resin sheet preformed, transferred and joined onto said main surface.

8. An electronic part according to claim 1, wherein the thickness of said support layer is 3 $\mu$m or more.

9. An electronic part according to claim 1, wherein the thermal expansion coefficient of said support layer is substantially the same as that of a material constituting said functional device chip.

10. An electronic part according to claim 1, wherein said cover is made of a synthetic resin film.

11. An electronic part according to claim 1, wherein said cover is made of a photosensitive resin film made by pattern formation.

12. An electronic part according to claim 1, wherein the surfaces of electrode pads formed on said functional device chip and connected to said electrode interconnection portions are made of metallic films mainly consisting of gold.

13. An electronic part according to claim 1, wherein an insulating inorganic film is formed and joined on said functional portion of said functional device chip.

14. An electronic part according to claim 1, wherein said cover of said space retainer is provided with an isolation layer on the external surface thereof, and said space retainer is joined to said sealing resin via said isolation layer.

15. An electronic part according to claim 14, wherein said isolation layer is made of a metallic film.

16. An electronic part according to claim 14, wherein said isolation layer is electrically connected to a grounding electrode formed on said functional device chip.

17. An electronic part according to claim 13, wherein said isolation layer is made of an insulating inorganic film.

18. An electronic part according to claim 17, wherein said isolation layer is formed so as to cover the entire external surfaces of said support layer and said cover of said space retainer.

19. An electronic part according to claim 14, wherein said isolation layer has a two-layer structure comprising a metallic film and an insulating inorganic film.

20. An electronic part according to claim 1, and wherein said electrode interconnection portions are made of thin metallic wires mainly consisting of gold or aluminum.

21. An electronic part according to claim 1, wherein said electrode interconnection portions comprise conductive projection portions made of a metal.

22. An electronic part according to claim 21, wherein said electrode interconnection portions comprise conductive projection portions made of a metal, and a conductive adhesive transferred and formed so as to receive the end portions of said conductive projection portions.

23. An electronic part according to claim 21, wherein said conductive projection portion is made of a metal mainly consisting of gold or a solder alloy.

24. An electronic part according to claim 21, wherein said conductive projection portion has a two-step projection structure provided with a small-diameter portion at the tip thereof.

25. An electronic part according to claim 21, wherein said conductive projection portions are formed on said functional device chip.

26. An electronic part according to claim 21, wherein the height of the first-step projection of said conductive projection portion having said two-step projection structure is made higher than the sum of the heights of said support layer and said cover.

27. An electronic part according to claim 21, wherein said conductive projection portion are formed on said circuit substrate.

28. An electronic part according to claim 21, wherein said electrode pads formed on said circuit substrate and connected said electrode interconnection portions are made thicker than other electrode patterns formed on said circuit substrate.

29. An electronic part according to claim 1, wherein said electronic part comprises a protection cap which is placed over said functional device chip secured to said circuit substrate, and secured to said circuit substrate via an adhesive.

30. An electronic part according to claim 29, wherein said protection cap is made of a metal and electrically connected to said grounding electrode formed on said circuit substrate.

31. An electronic part according to claim 29, wherein said protection cap is made of a liquid-crystal resin.

32. An electronic part according to claim 1, wherein a plurality of said functional device chips are integrally mounted on a single circuit substrate.

33. An electronic part according to claim 1, wherein said circuit substrate is a dielectric multilayer circuit substrate.

34. An electronic part according to claim 33, wherein passive devices are built in said circuit substrate.

35. An electronic part according to claim 4, wherein said electrode interconnection portions comprise conductive projection portions made of a metal.

36. An electronic part according to claim 22, wherein said conductive projection portion is made of a metal mainly consisting of gold or a solder alloy.

37. An electronic part according to claim 22, wherein said conductive projection portion has a two-step projection structure provided with a small-diameter portion at the tip thereof.

38. An electronic part according to claim 22, wherein said conductive projection portions are formed on said functional device chip.

39. An electronic part according to claim 22, wherein the height of the first-step projection of said conductive projection portion having said two-step projection structure is made higher than the sum of the heights of said support layer and said cover.

40. An electronic part according to claim 22, wherein said conductive projection portion are formed on said circuit substrate.

41. An electronic part according to claim 22, wherein said electrode pads formed on said circuit substrate and connected to said electrode interconnection portions are made thicker than other electrode patterns formed on said circuit substrate.

42. An electronic part according to claim 35, wherein said electrode interconnection portions comprise conductive projection made of a metal, and a conductive adhesive transferred and formed so as to receive the end portions of said conductive projection portions.

43. An electronic part according to claim 35, wherein said conductive projection portion is made of a metal mainly consisting of gold or a solder alloy.

44. An electronic part according to claim 35, wherein said conductive projection portion has a two-step projection structure provided with a small-diameter portion at the tip thereof.

45. An electronic part according to claim 35, wherein said conductive projection portions are formed on said functional device chip.

46. An electronic part according to claim 35, wherein the height of the first-step projection of said conductive projection portion having said two-step projection structure is made higher than the sum of the heights of said support layer and said cover.

47. An electronic part according to claim 35, wherein said conductive projection portion are formed on said circuit substrate.

48. An electronic part according to claim 35, wherein said electrode pads formed on said circuit substrate and connected to said electrode interconnection portions are made thicker than other electrode patterns formed on said circuit substrate.

* * * * *

UNITED STATES PATENT AND TRADEMARK OFFICE
CERTIFICATE OF CORRECTION

PATENT NO. : 5,920,142
DATED : July 6, 1999
INVENTOR(S) : Onishi et al.

It is certified that error appears in the above-identified patent and that said Letters Patent is hereby corrected as shown below:

At Column 22, line 42, insert -- to -- before "said".

At Column 23, line 23, insert -- portions -- before "made".

Signed and Sealed this

Eighteenth Day of April, 2000

Attest:

Q. TODD DICKINSON

Attesting Officer

Director of Patents and Trademarks